United States Patent
Bessho

(10) Patent No.: US 7,801,191 B2
(45) Date of Patent: Sep. 21, 2010

(54) SEMICONDUCTOR LASER DEVICE

(75) Inventor: Yasuyuki Bessho, Uji (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 80 days.

(21) Appl. No.: 12/254,204

(22) Filed: Oct. 20, 2008

(65) Prior Publication Data

US 2009/0103581 A1    Apr. 23, 2009

(30) Foreign Application Priority Data

Oct. 22, 2007  (JP)  ............................. 2007-274363
Oct. 16, 2008  (JP)  ............................. 2008-267164

(51) Int. Cl.
*H01S 3/04* (2006.01)

(52) U.S. Cl. ...................... 372/36; 372/34; 372/29.012

(58) Field of Classification Search .................. 372/34, 372/36, 29.012
See application file for complete search history.

(56) References Cited

U.S. PATENT DOCUMENTS

| 5,324,387 | A | * | 6/1994 | Andrews et al. .............. 438/28 |
| 6,587,491 | B1 | | 7/2003 | Yamamoto |
| 7,280,572 | B2 | | 10/2007 | Honda |
| 2008/0013576 | A1 | | 1/2008 | Honda |

FOREIGN PATENT DOCUMENTS

| JP | 2001-111152 A | 4/2001 |
| JP | 2004-006659 A | 1/2004 |
| JP | 2006-100376 A | 4/2006 |

* cited by examiner

*Primary Examiner*—Dung T Nguyen
(74) *Attorney, Agent, or Firm*—Marvin A. Motsenbocker; Mots Law, PLLC

(57) ABSTRACT

In a semiconductor laser device, in a case where an emission direction of a laser beam from a semiconductor laser element portion is a front side, a first front end of a first lead is arranged rearward beyond a first rear end of a second heatsink, and a second surface portion of the second heatsink electrically connected to the semiconductor laser element portion is electrically connected to the first front end.

19 Claims, 9 Drawing Sheets

SEMICONDUCTOR LASER DEVICE

CROSS-REFERENCE TO RELATED APPLICATIONS

The priority application number JP2007-274363, Semiconductor Laser Device, Oct. 22, 2007, Yasuyuki Bessho, JP2008-267164, Semiconductor Laser Device, Oct. 16, 2008, Yasuyuki Bessho, upon which this patent application is based is hereby incorporated by reference.

BACKGROUND OF THE INVENTION

1. Field of the Invention

The present invention relates to a semiconductor laser device, and more particularly, it relates to a semiconductor laser device mounted with a plurality of leads electrically isolated from each other, a heatsink and a semiconductor laser element portion.

2. Description of the Background Art

With reduction in the size and the thickness of an optical pickup, a semiconductor laser device employed as a light source has been required to be reduced in size. On the other hand, however, when the semiconductor laser device is downsized, a heatsink mounted on the semiconductor laser device is also downsized, thereby disadvantageously deteriorating heat radiability.

A semiconductor laser device suppressing reduction of heat radiability while enabling downsizing is heretofore proposed, as disclosed in Japanese Patent Laying-Open No. 2001-111152, for example.

The aforementioned Japanese Patent Laying-Open No. 2001-111152 discloses a semiconductor laser device comprising a laser chip (semiconductor laser element portion), a heatsink mounted with the laser chip and three leads electrically isolated from each other. In this semiconductor laser device, assuming that an emission direction of a laser beam is a front side, a rear end of the heatsink is arranged frontward of forward ends of the leads. The heatsink is so formed as to extend in a direction of an upper side where the laser chip is mounted. Thus, the size of the heatsink can be increased without increasing the size of the semiconductor laser device. Consequently, deterioration of heat radiability can be suppressed while enabling downsizing of the semiconductor laser device. In the semiconductor laser device disclosed in the aforementioned Japanese Patent Laying-Open No. 2001-111152, a surface of the heatsink is connected to side surfaces of the leads through wires.

In the semiconductor laser device described in the aforementioned Japanese Patent Laying-Open No. 2001-111152, however, while the reduction of the heat radiability can be suppressed to some extent while enabling downsizing, the distance between the rear end of the heatsink and a body is increased and hence the heat radiability is deteriorated. Additionally, the length of the semiconductor laser device in the emission direction of the laser beam of is increased. Further, leads and a surface portion of the heatsink arranged frontward of the leads are connected to the side surfaces of the leads through the wires and hence the length of each wire is disadvantageously longer than the shortest distance from the surface of the heatsink to each lead. Thus, inductance of the semiconductor laser device is increased as compared with a case of connection at the shortest distance, and hence high speed responsibility is disadvantageously deteriorated.

SUMMARY OF THE INVENTION

The present invention has been proposed in order to solve the aforementioned problem, and an object of the present invention is to provide a semiconductor laser device capable of suppressing deterioration in heat radiability while enabling downsizing, and improving high speed responsibility.

In order to attain the aforementioned object, a semiconductor laser device according to an aspect of the present invention comprises a package including a body and a first heatsink, a second heatsink mounted on a first surface portion of the first heatsink, a semiconductor laser element portion mounted on a second surface portion of the second heatsink, and a first lead mounted by passing through a third surface portion of the body arranged with the first heatsink, wherein a first front end of the first lead is arranged rearward beyond a first rear end of the second heatsink in a case where an emission direction of a laser beam from the semiconductor laser element portion is a front side, and the second surface portion electrically connected to the semiconductor laser element portion is electrically connected to the first front end. In the present invention, the "electrically connected to the first front end" means "electrically connected through a wire or the like", for example.

In the present invention, the emission direction of the laser beam is an emission direction of a laser beam having relatively large light intensity among laser beams emitted from a pair of cavity facets.

In the semiconductor laser device according to the aspect of the present invention, as hereinabove described, the first front end of the first lead is arranged rearward beyond the first rear end of the second heatsink in the case where the emission direction of the laser beam from the semiconductor laser element portion is the front side. According to this structure, the width of the second heatsink can be widened outward beyond the first lead and hence the volume of the second heatsink can be increased without increasing the size of the semiconductor laser device. Thus, deterioration in heat radiability can be suppressed while enabling downsizing.

The second surface portion of the second heatsink is electrically connected to the first front end of the first lead, whereby the connection can be made at a short distance as close as possible to the shortest distance from the second surface portion of the second heatsink to the first lead. Thus, inductance of the semiconductor laser device can be reduced as small as possible, and hence high speed responsibility can be improved. The length of the first lead protruding from the third surface portion of the body mounted with the first heatsink in the emission direction can be reduced and hence the distance between the first rear end of the second heatsink and the body can be reduced. Consequently, heat radiability is further improved.

In the aforementioned semiconductor laser device according to the aspect, the second surface portion of the second heatsink and the first front end of the first lead are preferably connected to each other through a wire. According to this structure, the second surface portion of the second heatsink and the first front end of the first lead can be easily connected to each other.

In the aforementioned semiconductor laser device according to the aspect, a first side surface of the second heatsink is preferably arranged outward beyond an inner side surface of the first lead in a horizontal direction, where the horizontal direction is a direction perpendicular to the emission direction and parallel to the first surface portion.

According to this structure, the volume of the second heatsink can be easily increased and hence deterioration in heat radiability can be easily suppressed.

In this case, the first side surface is preferably arranged outward beyond an outer side surface of the first lead in the horizontal direction. According to this structure, the volume of the second heatsink can be easily increased and hence deterioration in heat radiability can be easily suppressed.

The aforementioned semiconductor laser device according to the aspect preferably further comprises a second lead mounted by passing through the third surface portion and electrically isolated from the first lead, wherein a second front end of the second lead is preferably arranged rearward beyond the first rear end, and the semiconductor laser element portion is preferably electrically connected to the second front end. According to this structure, the width of the second heatsink in the horizontal direction can be widened outward of a side closer to the second lead in addition to outward of a side closer to the first lead and hence the volume of the second heatsink can be increased. Consequently, deterioration in heat radiability can be suppressed. The semiconductor laser element portion is electrically connected to the second front end of the second lead, whereby the connection can be made at a short distance as close as possible to the shortest distance from the semiconductor laser element portion to the second lead. Thus, inductance of the semiconductor laser device can be further reduced, and hence high speed responsibility can be further improved.

In this case, the second surface portion preferably has a first electrode and a second electrode electrically isolated from each other, the first electrode is preferably electrically connected to a back surface of the semiconductor laser element portion, and the second electrode is preferably electrically connected to an opposite surface of the semiconductor laser element portion to the back surface and also electrically connected to the second front end. According to this structure, the connection can be made at a short distance as an overall length as compared with a case where the surface of the semiconductor laser element portion and the second front end of the second lead are directly electrically connected to each other. Thus, inductance of the semiconductor laser device can be further reduced, and hence high speed responsibility can be further improved.

In this case, the first front end and the second front end are preferably arranged at the same plane perpendicular to the emission direction. According to this structure, the position of the first rear end of the second heatsink is not restricted by the position of the front end of either the first lead or the second lead which is arranged to be closer to the front side, dissimilarly to a case where the positions of the first front end of the first lead and the second front end of the second lead deviate from each other. Consequently, the overall first rear end of the second heatsink can be widened rearward, and hence deterioration in heat radiability can be further suppressed.

In this case, a first side surface of the second heatsink is preferably arranged outward in a horizontal direction beyond an inner side surface of the first lead and a second side surface of the second heatsink on a side on which the second lead is arranged is preferably arranged outward in the horizontal direction beyond an inner side surface of the second lead, where the horizontal direction is a direction perpendicular to the emission direction and parallel to the first surface portion. According to this structure, the second heatsink can be easily widened toward not only a side closer to the first lead but also a side closer to the second lead. Thus, the volume of the second heatsink can be easily increased, and hence deterioration in heat radiability can be easily suppressed.

In this case, the first side surface is preferably arranged outward in the horizontal direction beyond an outer side surface of the first lead, and the second side surface is preferably arranged outward in the horizontal direction beyond an outer side surface of the second lead. According to this structure, the volume of the second heatsink can be easily further increased, and hence deterioration in heat radiability can be further easily suppressed.

In this case, a width of the first heatsink in a horizontal direction is preferably larger than an inner interval between the first lead and the second lead, where the horizontal direction is a direction perpendicular to the emission direction and parallel to the first surface portion. According to this structure, the volume of the first heatsink can be increased and the volume of the second heatsink mounted on the first heatsink can be also increased, and hence deterioration in heat radiability can be further suppressed.

In this case, a width of the second heatsink in a horizontal direction is preferably larger than an inner interval between the first lead and the second lead, where the horizontal direction is a direction perpendicular to the emission direction and parallel to the first surface portion. According to this structure, the volume of the second heatsink can be increased and hence deterioration in heat radiability can be further suppressed.

In this case, the body preferably has an substantially circular outer shape as viewed from a side of the emission direction, the package further includes a third lead arranged on the body and electrically isolated from the first lead and the second lead, the first lead, the second lead and the third lead are arranged on a segment constituting a prescribed circle as viewed from the side of the emission direction, and a center of the prescribed circle is arranged to deviate from a center of the body in a direction for separating from the first heatsink. According to this structure, the first lead and the second lead can be separated from the first heatsink and hence the volume of the first heatsink can be increased. Consequently, deterioration in heat radiability can be suppressed.

In the aforementioned semiconductor laser device according to the aspect, the first front end is preferably arranged on substantially the same plane as the third surface portion. According to this structure, the first front end of the first lead can be arranged further rearward with respect to the emission direction. Thus, the first rear end of the second heatsink can be further widened rearward, and hence deterioration in heat radiability can be suppressed.

In the aforementioned semiconductor laser device according to the aspect, one part of an outer shape of the body as viewed from a side of the emission direction is preferably formed in a linear shape and a portion other than the one part is formed in an arc shape. According to this structure, the height or the width of the outer shape can be reduced as compared with a case where the outer shape of the body is circularly formed, and hence the semiconductor laser device can be easily downsized.

In this case, at least two of portions each having the linear shape are preferably formed. According to this structure, the height or width of the outer shape can be further reduced as compared with a case where only one portion of the outer shape is formed in the linear shape, and hence the semiconductor laser device can be easily downsized.

In the aforementioned semiconductor laser device according to the aspect, the front end surface is preferably inclined in a direction for forming an obtuse angle with respect to the second surface portion. According to this structure, the semiconductor laser element portion is unlikely to hinder when the first front end of the first lead and the second surface portion of the second heatsink are electrically connected to each other through a wire or the like. Consequently, wiring between the first front end of the first lead and the second surface portion of the second heatsink can be easily accomplished.

In this case, the aforementioned semiconductor laser device according to the aspect further comprises a second lead mounted by passing through the third surface portion and electrically isolated from the first lead, wherein a second front end of the second lead is arranged frontward beyond the first rear end of the second heatsink. According to this structure, the side surface of the second lead extending in the emission direction and the front surface of the semiconductor laser element portion can be easily connected to each other.

In this case, a width of the first heatsink in a horizontal direction is preferably larger than an inner interval between the first lead and the second lead, where the horizontal direction is a direction perpendicular to the emission direction and parallel to the first surface portion. According to this structure, the volume of the first heatsink can be increased and the volume of the second heatsink mounted on the first heatsink can be also increased, and hence deterioration in heat radiability can be suppressed.

In this case, the body preferably has an substantially circular outer shape as viewed from a side of the emission direction and the package further includes a third lead arranged on the body and electrically isolated from the first lead and the second lead, the first lead, the second lead and the third lead are preferably arranged on a segment constituting a prescribed circle as viewed from the side of the emission direction, and a center of the prescribed circle is preferably arranged to deviate from a center of the body in a direction for separating from the first heatsink. According to this structure, the first lead and the second lead can be separated from the first heatsink and hence the volume of the first heatsink can be increased. Consequently, deterioration in heat radiability can be further suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

First Embodiment

A structure of a semiconductor laser device 1 according to a first embodiment of the present invention will be described with reference to FIGS. 1 to 4.

Figure 1:
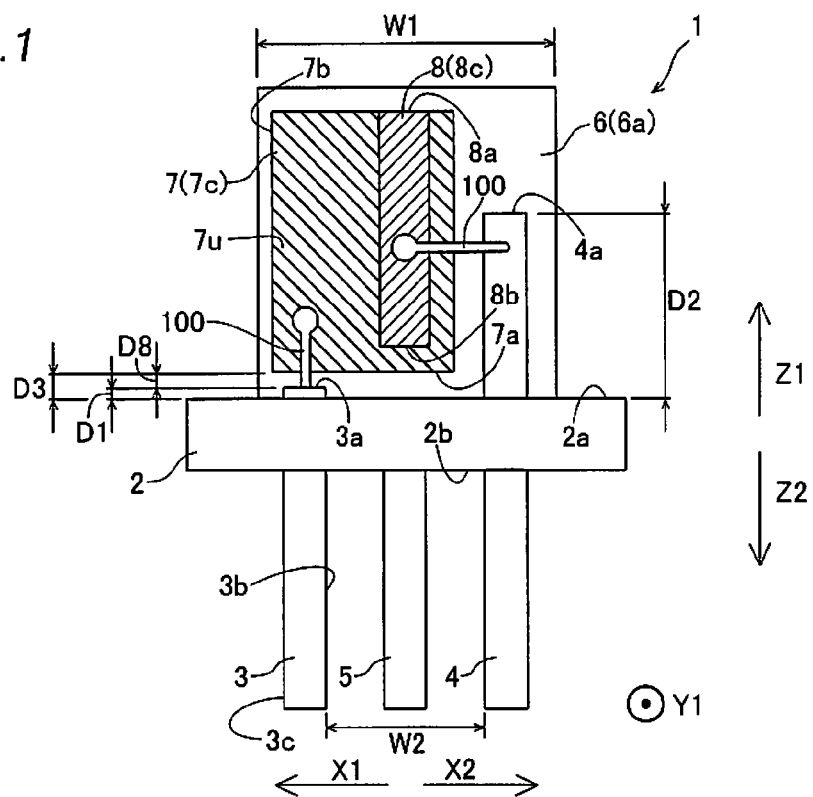
FIG. 1 is a plan view for illustrating a structure of a semiconductor laser device according to a first embodiment of the present invention.
Figure 2:
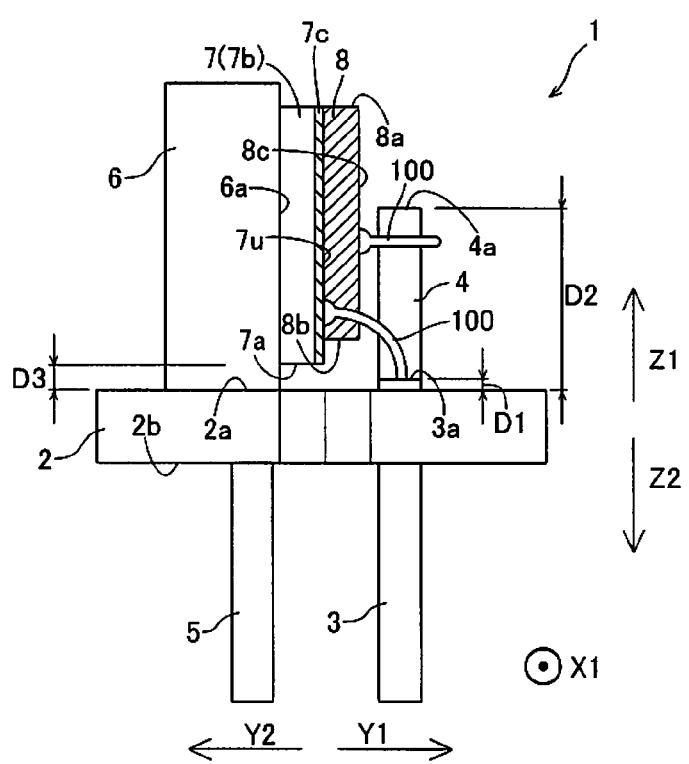
FIG. 2 is a side elevational view for illustrating the structure of the semiconductor laser device according to the first embodiment shown in FIG. 1.
Figure 3:
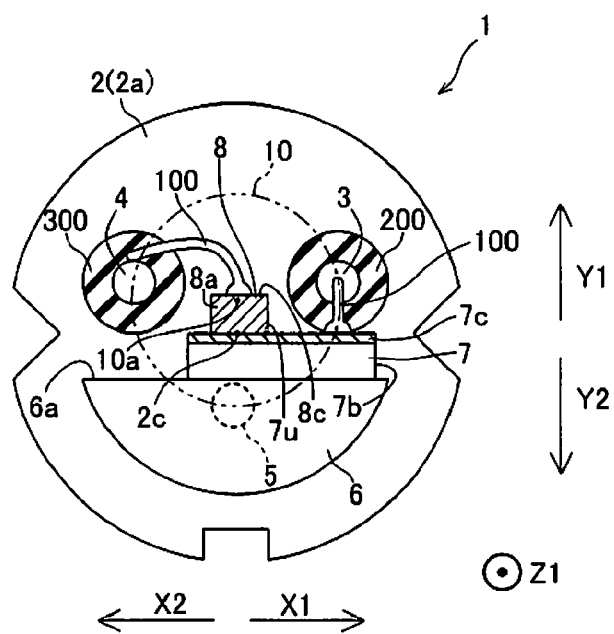
FIG. 3 is a front elevational view of the semiconductor laser device according to the first embodiment shown in FIG. 1, as viewed from a side of an emission direction of a laser beam.

As shown in FIGS. 1 to 3, the semiconductor laser device 1 according to the first embodiment of the present invention comprises a base 2, leads 3, 4 and 5 mounted on the base 2 and electrically isolated from each other and a header 6 mounted on the base 2, and the base 2, the lead 5, and the header 6 constitute a package. The semiconductor laser device 1 further comprises a submount 7 made of aluminum nitride (AlN) mounted on the header 6 and a semiconductor laser element portion 8 mounted on the submount 7. The base 2 is an example of the "body" in the present invention. The lead 3, the lead 4 and the lead 5 are examples of the "first lead", the "second lead" and the "third lead" in the present invention, respectively. The header 6 is an example of the "first heatsink" in the present invention, and the submount 7 is an example of the "second heatsink" in the present invention.

Figure 4:
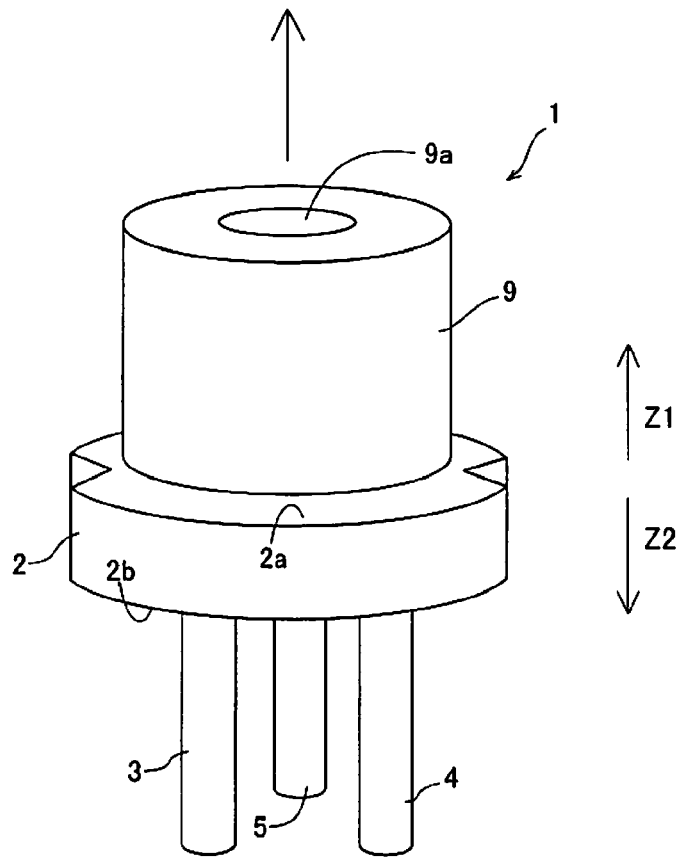
FIG. 4 is a perspective view for illustrating the structure of the semiconductor laser device according to the first embodiment shown in FIG. 1.

As shown in FIG. 4, the semiconductor laser device 1 is mounted with a cap 9 on a surface 2a of the base 2 on a side of an emission direction of a laser beam (along arrow Z1 (on a front side)). The surface 2a is an example of the "third surface portion" in the present invention. This cap 9 is formed with an optical window 9a transmitting a laser beam emitted from the semiconductor laser element portion 8. FIGS. 1 to 3 and FIGS. 5 to 18 described later show the semiconductor laser device with the cap 9 omitted for clarity of illustration.

The emission direction of the laser beam emitted from the semiconductor laser element portion 8 and a direction opposite thereto are shown by arrows Z1 and Z2 respectively, and the direction along arrow Z1 (front direction) and the direction along arrow Z2 (rear direction) are referred to as an anteroposterior direction of the semiconductor laser device 1. A direction (in which the submount 7 is mounted with respect to a surface 6a) perpendicular to the surface 6a which is an upper surface of the header 6 mounted with the submount 7 is shown by arrow Y1 while a direction opposite to the direction along arrow Y1 is shown by arrow Y2, and the direction along arrow Y1 (upper direction) and the direction along arrow Y2 (lower direction) are referred to as a vertical direction of the semiconductor laser device 1. Directions perpendicular to both of the directions along arrows Z1 and Z2 and the directions along arrows Y1 and Y2 are shown by arrows X1 and X2, which are referred to as a horizontal direction of the semiconductor laser device 1. These respective directions are similar to those in respective embodiments described later. The surface 6a of the header 6 is an example of the "first surface portion" in the present invention.

The base 2 is substantially circularly formed as viewed from a side of the emission direction of the laser beam (along arrow Z1 (front side)). The base 2 is made of metal such as iron or copper and hence has high heat radiability.

The leads 3 and 4 are made of metal and are so arranged as to pass through the surface 2a of the base 2 and a surface 2b of the base 2 along arrow Z2 (on a rear side). The lead 3 is so formed that a front end 3a on the front side (along arrow Z1) is arranged to protrude along arrow Z1 (frontward) from the surface 2a of the base 2 along arrow Z1 (on the front side) by a distance D1. The front end 3a of the lead 3 is an example of the "first front end" in the present invention. The lead 4 is so formed that a front end 4a along arrow Z1 (on the front side) is arranged to protrude along arrow Z1 (frontward) from the surface 2a of the base 2 along arrow Z1 (on the front side) by a distance D2, and a side surface thereof extends in the emission direction of the laser beam (along arrow Z1). The front end 4a of the lead 4 is an example of the "second front end" in the present invention. The lead 5 is arranged on the surface 2b of the base 2 along arrow Z2 (on the rear side) by welding the lead 5 on the surface 2b.

As shown in FIG. 3, the leads 3, 4 and 5 are arranged on a segment constituting a prescribed circle 10 as viewed from a side along arrow Z1 (front side). A center 10a of the prescribed circle 10 is arranged to deviate from a center 2c of the circular base 2 in a direction for separating from the surface 6a which is the upper surface of the header 6 (along arrow Y1). Thus, the leads 3 and 4 can be separated as far as possible from the header 6 arranged on a side along arrow Y2.

As shown in FIG. 3, the leads 3 and 4 are covered with insulators 200 and 300 made of glass on through portions of the base 2 respectively. Thus, the leads 3 and 4 are electrically insulated from the base 2. According to the first embodiment of the present invention, the lead 5 is not employed for feeding a current. This lead 5 is formed integrally with the base 2.

According to the first embodiment, the header 6 is mounted on the surface 2a of the base 2 along arrow Z1 (on the front side), so that the header 6 is arranged on the base 2 and the header 6 are electrically connected to each other. As shown in FIG. 1, a width W1 of the header 6 in the horizontal direction, namely along arrows X1 and X2 (in a direction perpendicular to the emission direction of the laser beam (along arrow Z1)) is rendered larger than an inner interval W2 between the lead 3 and the lead 4. As shown in FIG. 3, the surface 6a along arrow Y1 which is the upper surface of the header 6 is flatly formed and a back surface along arrow Y2 is formed in an arc shape. The header 6 is made of metal, and hence has high heat radiability. Thus, the header 6 can functions as a heatsink of the semiconductor laser device 1.

The submount 7 has a rectangular parallelepiped shape, is mounted on the surface 6a along arrow Y1 which is the upper surface of the header 6 through a conductive bonding layer (not shown) such as AuSn solder, and the surface 6a of the header 6 is electrically connected to a surface portion along arrow Y2 which is a back surface of the submount 7. In the submount 7, a surface 7a along arrow Z2 (on the rear side) is arranged on the side along arrow Z1 (front side) from the surface 2a of the base 2 along arrow Z1 (on the front side) by a distance D3. The surface 7a of the submount 7 is an example of the "first rear end" in the present invention. More specifically, the submount 7 is so arranged that the distance D3 is larger than the distance D1 and smaller than the distance D2. In other words, the surface 7a of the submount 7 along arrow Z2 (on the rear side) is arranged to be closer to the side along arrow Z1 (front side) than the front end 3a of the lead 3 and to be closer to the side along arrow Z2 (rear side) than the front end 4a of the lead 4.

The front end 3a of the lead 3 and the surface 7a of the submount 7 along arrow Z2 (on the rear side) are separated with a distance D8 therebetween. As shown in FIG. 1, a side surface 7b of the submount 7 along arrow X1 is arranged outward (on a side along arrow X1) in the horizontal direction beyond an inner side surface 3b which is a side surface of the lead 3 along arrow X2. Further, the side surface 7b is arranged outward beyond an outer side surface 3c which is a side surface of the lead 3 along arrow X1. The side surface 7b of the submount 7 along arrow X1 is an example of the "first side surface" in the present invention.

The insulating submount 7 made of AlN includes an electrode 7c made of a Ti layer, a Pt layer and an Au layer on a surface portion 7u along arrow Y1 which is an upper surface. The surface portion 7u of the submount 7 is an example of the "second surface portion" in the present invention. The electrode 7c is connected to the front end 3a of the lead 3 through an Au wire 100. Similarly to the header 6, the submount 7 is so formed as to function as the heatsink of the semiconductor laser device 1.

The semiconductor laser element portion 8 has a rectangular parallelepiped shape and includes a first electrode (not shown) on a surface along arrow Y2 which is a back surface and a second electrode (not shown) on a surface 8c along arrow Y1 which is an upper surface. The surface of the semiconductor laser element portion 8 along arrow Y2 is mounted on the electrode 7c of the submount 7 through the conductive bonding layer (not shown) such as AuSn solder or the like. Thus, the back surface of the semiconductor laser element portion 8 is electrically connected to the lead 3 through the electrode 7c and the wire 100.

The semiconductor laser element portion 8 includes a light emitting surface 8a and a light reflecting surface 8b in an extensional direction (along arrows Z1 and Z2) of a cavity. The light intensity of the laser beam emitted from the light emitting surface 8a along arrow Z1 is larger than the light intensity of the laser beam emitted from the light reflecting surface 8b along arrow Z2. The semiconductor laser element portion 8 is so formed as to emit blue-violet light having a wavelength of about 405 nm. A surface 8c of the semiconductor laser element portion 8 opposite to the submount 7 (along arrow Y1) which is the upper surface is connected to a side surface of the lead 4 through an Au wire 100. Thus, the surface 8c of the semiconductor laser element portion 8 is electrically connected to the lead 4.

According to the first embodiment, as hereinabove described, the front end 3a of the lead 3 is arranged to be closer to the side along arrow Z2 (rear side) than the surface 7a of the submount 7 along arrow Z2 (rear side), whereby the width W1 (side surface 7b) of the submount 7 can be widened outward (along arrow X1). According to this structure, the volume of the submount 7 can be increased without increasing the semiconductor laser device 1, and hence deterioration in heat radiability can be suppressed while enabling downsizing.

The electrode 7c of the submount 7 and the front end 3a of the lead 3 are connected to each other through the Au wire 100, whereby the surface portion 7u of the submount 7 and the front end 3a of the lead 3 can be easily connected to each other. Further, the connection is made through the Au wire 100 having a short length as close as possible to the shortest distance from the electrode 7c of the submount 7 to the lead 3, and hence inductance of the semiconductor laser device 1 can be reduced as small as possible. Thus, high speed responsibility can be improved. The distance D1 of the lead 3 protruding from the base 2 to the emission direction of the laser beam (along arrow Z1) can be reduced and hence the distance D3 between the surface 7a of the submount 7 along arrow Z2 and the base 2 can be reduced, thereby further improving heat radiability.

According to the first embodiment, the side surface 7b of the submount 7 along arrow X1 is arranged outward (on the side along arrow X1) in the horizontal direction beyond the inner side surface 3b of the lead 3, whereby the volume of the submount 7 can be easily increased and hence deterioration in heat radiability can be easily suppressed. Further, according to the first embodiment, the side surface 7b of the submount 7 along arrow X1 is arranged outward (on the side along arrow X1) in the horizontal direction beyond the outer side surface 3c of the lead 3, whereby the volume of the submount 7 can be further easily increased and hence deterioration in heat radiability can be further easily suppressed.

According to the first embodiment, the lead 3, the lead 4 and the lead 5 are arranged on the segment constituting the prescribed circle 10 and the center 10a of the prescribed circle 10 is arranged to deviate from the center 2c of the base 2 in a direction for separating from the surface 6a which is the upper surface of the header 6. Thus, the lead 3 and the lead 4 are separated from the header 6 and hence the volume of the header 6 can be increased. Consequently, deterioration in heat radiability can be suppressed.

According to the first embodiment, the width W1 of the header 6 is larger than the inner interval W2 between the lead 3 and lead 4 in the horizontal direction. Thus, the volume of the header 6 can be increased and be rendered larger than the volume of the submount 7 mounted on the header 6. Consequently, deterioration in heat radiability can be further suppressed.

According to the first embodiment, the front end 4a of the lead 4 is arranged frontward beyond the surface 7a of the submount 7 along arrow Z2, and hence the side surface of the lead 4 and the surface 8c which is the upper surface of the semiconductor laser element portion 8 can be easily connected to each other.

Second Embodiment

Figure 5:
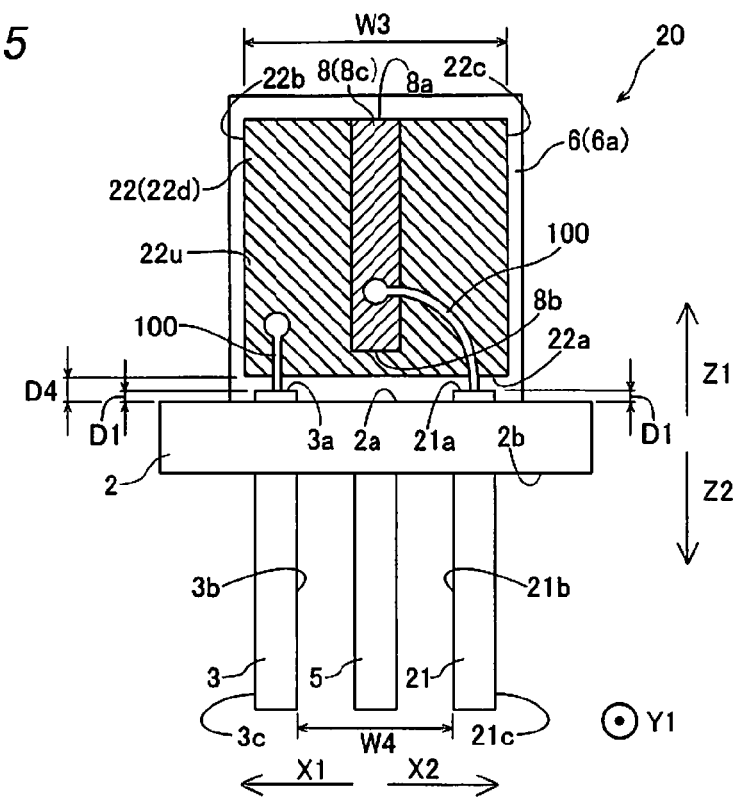
FIG. 5 is a plan view for illustrating a structure of a semiconductor laser device according to a second embodiment of the present invention.
Figure 6:
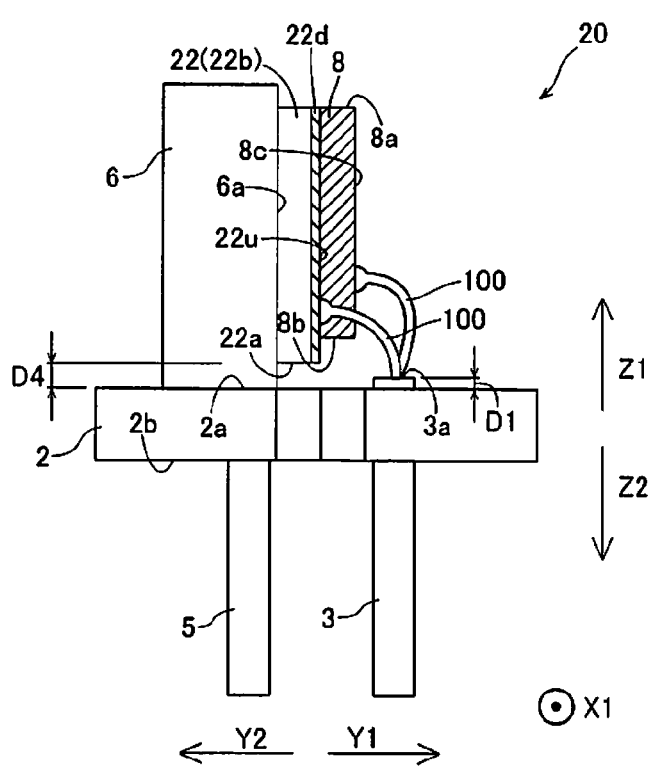
FIG. 6 is a side elevational view for illustrating the structure of the semiconductor laser device according to the second embodiment shown in FIG. 5.
Figure 7:
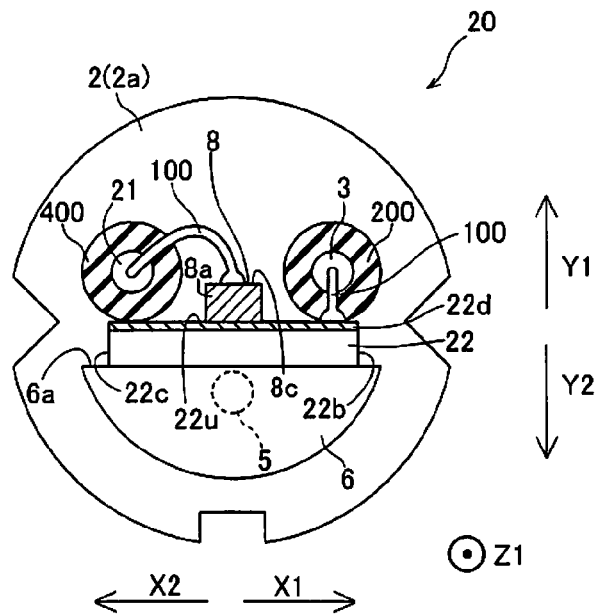
FIG. 7 is a front elevational view of the semiconductor laser device according to the second embodiment shown in FIG. 5, as viewed from a side of an emission direction of a laser beam.

Referring to FIGS. 5 to 7, in a semiconductor laser device 20 according to a second embodiment, a front end 21a of a lead 21 along arrow Z1 (on a front side) is arranged on a side along arrow Z1 (front side) from a surface 2a of a base 2 along arrow Z1 (on the front side) by a distance D1, dissimilarly to the aforementioned first embodiment. The lead 21 is an example of the "second lead" in the present invention. The structure shown in FIGS. 5 to 7 similar to that of the first embodiment is denoted by the same reference numerals.

The semiconductor laser device 20 according to the second embodiment comprises the base 2, leads 3, 5 and 21 mounted on the base 2 and electrically isolated from each other and a header 6 mounted on the base 2, as shown in FIGS. 5 to 7. The semiconductor laser device 20 further comprises a submount 22 made of aluminum nitride (AlN) mounted on the header 6 and a semiconductor laser element portion 8 mounted on the submount 22. The submount 22 is an example of the "second heatsink" in the present invention.

According to the second embodiment, the lead 21 is made of metal and so arranged as to pass through the surface 2a of the base and a surface 2b of the base 2 along arrow Z2 (on a rear side) and is covered with an insulator 400 made of glass on a through portion thereof. Thus, the lead 21 is electrically insulated from the base 2. Similarly to the lead 3, the lead 21 is so formed that a front end 21a on the front side (along arrow Z1) is arranged to protrude along arrow Z1 (frontward) from a surface 2a of the base 2 along arrow Z1 (on the front side) by a distance D1. In other words, the front end 3a of the lead 3 and the front end 21a of the lead 21 are arranged on the same plane perpendicular to an emission direction of a laser beam (direction along arrow Z1). The front end 21a of the lead 21 is an example of the "second front end" in the present invention.

According to the second embodiment, the submount 22 has a rectangular parallelepiped shape, is mounted on a surface 6a of the header 6 along arrow Y1 which is an upper surface through a conductive bonding layer (not shown) such as AuSn solder, and the surface 6a of the header is electrically connected to a surface portion along arrow Y2 which is a back surface of the submount 22. In the submount 22, a surface 22a along arrow Z2 (on the rear side) is arranged on the side along arrow Z1 (front side) from the surface 2a of the base 2 along arrow Z1 (on the front side) by a distance D4. The surface 22a of the submount 22 is an example of the "first rear end" in the present invention.

More specifically, the submount 22 is so arranged that the distance D4 is larger than the distance D1. In other words, the surface 22a of the submount 22 along arrow Z2 (on the rear side) is arranged to be closer to the side along arrow Z1 (front side) than the front end 3a of the lead 3 and the front end 21a of the lead 21.

As shown in FIG. 5, a side surface 22b of the submount 22 along arrow X1 is arranged outward (on a side along arrow X1) in a horizontal direction beyond an inner side surface 3b which is a side surface of the lead 3 along arrow X2. Further, the side surface 22b is arranged outward in the horizontal direction beyond an outer side surface 3c which is a side surface of the lead 3 along arrow X1. The side surface 22b of the submount 22 along arrow X1 is an example of the "first side surface" in the present invention.

A side surface 22c (second side surface of the second heatsink) of the submount 22 along arrow X2 is arranged outward (on a side along arrow X2) in the horizontal direction beyond an inner side surface 21b which is a side surface of the lead 21 along arrow X1. Further, the side surface 22c is arranged outward in the horizontal direction beyond an outer side surface 21c which is a side surface of the lead 21 along arrow X2. Thus, a width W3 of the submount 22 along arrows X1 and X2 (in a direction perpendicular to the emission direction of the laser beam (along arrow Z1)) can be rendered larger than an inner interval W4 between the lead 3 and the lead 21.

The insulating submount 22 made of AlN includes an electrode 22d made of a Ti layer, a Pt layer and an Au layer on a surface portion 22u along arrow Y1 which is an upper surface. The surface portion 22u of the submount 22 is an example of the "second surface portion" in the present invention. The electrode 22d is connected to the front end 3a of the lead 3 through an Au wire 100. The submount 22 is so formed as to function as a heatsink of the semiconductor laser device 20.

According to the second embodiment, a surface along arrow Y2 which is a back surface of the semiconductor laser element portion 8 is mounted on the electrode 22d of the submount 22 through the conductive bonding layer (not shown) such as AuSn solder or the like. Thus, the back surface of the semiconductor laser element portion 8 is electrically connected to the lead 3 through the electrode 22d and the wire 100. A surface 8c along arrow Y1 which is an upper surface of the semiconductor laser element portion 8 is connected to the front side surface 21a of the lead 21 through an Au wire 100. Thus, the surface 8c of the semiconductor laser element portion 8 is electrically connected to the lead 21.

The remaining structure of the semiconductor laser device 20 according to the second embodiment is similar to that of the semiconductor laser device according to the aforementioned first embodiment.

According to the second embodiment, as hereinabove described, the front end 21a of the lead 21 is arranged to be closer to the side along arrow Z2 (rear side) than the surface 22a of the submount 22 along arrow Z2 (on the rear side). According to this structure, the width W3 of the submount 22 along arrows X1 and X2 can be widened outward (along arrow X2) of the lead 21 in addition to outward of the lead 3 (along arrow X1). Thus, the volume of the submount 22 can be increased, and hence deterioration in heat radiability can be suppressed.

According to the second embodiment, the side surface 22b of the submount 22 is arranged outward beyond the inner side surface 3b of the lead 3, and the side surface 22c of the submount 22 is arranged outward beyond the inner side surface 21b of the lead 21. Thus, the submount 22 can be easily widened not only toward the lead 3 but also toward the lead 21, and hence the volume of the submount 22 can be easily increased. Consequently, deterioration of heat radiability can be easily suppressed.

According to the second embodiment, the side surface 22b of the submount 22 is arranged outward beyond the outer side surface 3c of the lead 3, and the side surface 22c of the submount 22 is arranged outward beyond the outer side surface 21c of the lead 21. Thus, the volume of the submount 22 can be further increased. Consequently, deterioration of heat radiability can be further easily suppressed.

According to the second embodiment, the width W3 of the submount 22 in the horizontal direction is larger than the inner interval W4 between the lead 3 and the lead 21, and hence the volume of the submount 22 can be increased. Thus, deterioration in heat radiability can be suppressed.

According to the second embodiment, the surface 8c which is the upper surface of the semiconductor laser element portion 8 is connected to the front end 21a of the lead 21 through an Au wire 100. Thus, the surface 8c of the semiconductor laser element portion 8 and the front end 21a of the lead 21 can be easily connected to each other. Further, the electrical connection (wiring) can be made through the Au wire 100 having a short length as close as possible to the shortest distance from the semiconductor laser element portion 8 to the lead 21, and hence inductance of the semiconductor laser device 20 can be reduced. Consequently, high speed responsibility can be improved.

According to the second embodiment, the front end 3a of the lead 3 and the front end 21a of the lead 21 are arranged on the same plane perpendicular to an emission direction of a laser beam (direction along arrow Z1). Thus, the position of the surface 22a of the submount 22 is not restricted by the position of the front end of either the lead 3 or the lead 21 which is arranged to be closer to the front side (along arrow Z1), dissimilarly to a case where the positions of the front ends of the leads 3 and 21 deviate from each other. Consequently, the overall surface 22a of the submount 22 can be widened rearward (along arrow Z2), and hence deterioration in heat radiability can be further suppressed.

The remaining effects of the second embodiment are similar to those of the aforementioned first embodiment.

Third Embodiment

Figure 8:
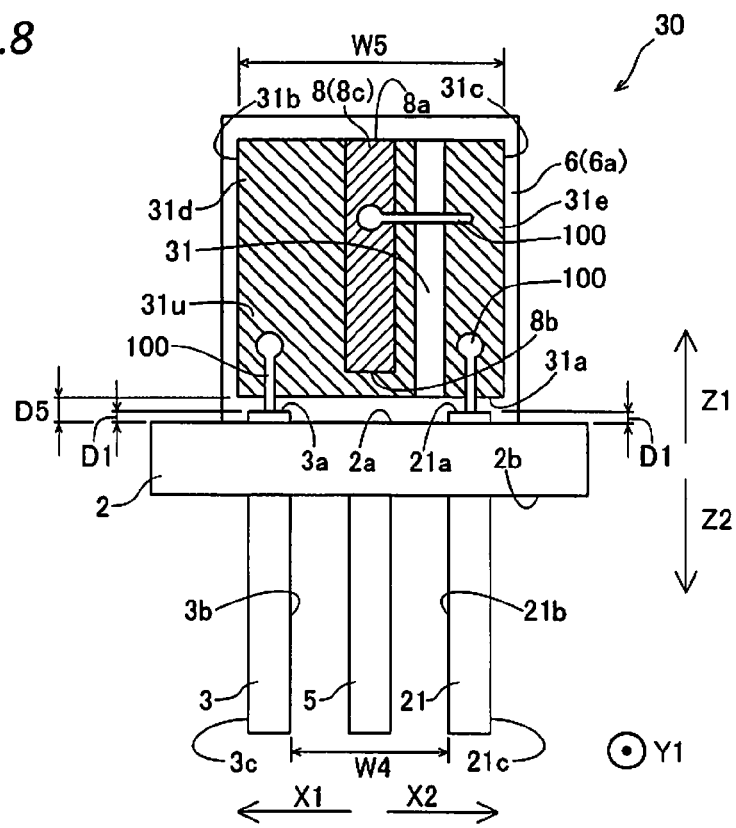
FIG. 8 is a plan view for illustrating a structure of a semiconductor laser device according to a third embodiment of the present invention.

Referring to FIG. 8, in a semiconductor laser device 30 according to a third embodiment, a submount 31 includes an electrode 31d and an electrode 31e electrically isolated from each other on a surface portion 31u along arrow Y1 which is an upper surface, dissimilarly to the aforementioned second embodiment. The submount 31 and the surface portion 31u are examples of the "second heatsink" and the "second surface portion" in the present invention respectively. The electrode 31d is an example of the "first electrode" in the present invention, and the electrode 31e is an example of the "second electrode" in the present invention. The structure shown in FIG. 8 similar to that of the second embodiment is denoted by the same reference numerals.

The semiconductor laser device 30 according to the third embodiment comprises a base 2, leads 3, 5 and 21 mounted on the base 2 and electrically isolated from each other and a header 6 mounted on the base 2, as shown in FIG. 8. The semiconductor laser device 30 further comprises a submount 31 made of aluminum nitride (AlN) mounted on the header 6 and a semiconductor laser element portion 8 mounted on the submount 31.

According to the third embodiment, the submount 31 has a rectangular parallelepiped shape, is mounted on a surface 6a along arrow Y1 which is the upper surface of the header 6 through a conductive bonding layer (not shown) such as AuSn solder, and the surface 6a of the header 6 is electrically connected to a surface portion along arrow Y2 which is a back surface of the submount 31. In the submount 31, a surface 31a along arrow Z2 (on the rear side) is arranged on the side along arrow Z1 (front side) from a surface 2a of the base 2 along arrow Z1 (on the front side) by a distance D5. The surface 31a of the submount 31 is an example of the "first rear end" in the present invention.

More specifically, the submount 31 is so arranged that the distance D5 is larger than a distance D1. In other words, the surface 31a of the submount 31 along arrow Z2 (on the rear side) is arranged to be closer to the side along arrow Z1 (front side) than the front end 3a of the lead 3 and the front end 21a of the lead 21.

A side surface 31b of the submount 31 along arrow X1 is arranged outward (on a side along arrow X1) in a horizontal direction beyond an inner side surface 3b which is a side surface of the lead 3 along arrow X2. Further, the side surface 31b is arranged outward in the horizontal direction beyond an outer side surface 3c which is a side surface of the lead 3 along arrow X1. The side surface 31b of the submount 31 along arrow X1 is an example of the "first side surface" in the present invention.

A side surface 31c (second side surface of the second heatsink) of the submount 31 along arrow X2 is arranged outward (on a side along arrow X2) in the horizontal direction beyond an inner side surface 21b which is a side surface of the lead 21 along arrow X1. Further, the side surface 31c is arranged outward in the horizontal direction beyond an outer side surface 21c which is a side surface of the lead 21 along arrow X2. Thus, a width W5 of the submount 31 along arrows X1 and X2 (in a direction perpendicular to the emission direction of the laser beam (along arrow Z1)) can be rendered larger than an inner interval W4 between the lead 3 and the lead 21.

The insulating submount 31 made of AlN includes the electrode 31d and the electrode 31e made of Ti layers, Pt layers and Au layers and electrically isolated from each other on the surface portion 31u along arrow Y1 which is the upper surface. The surface portion 31u of the submount 31 is an example of the "second surface portion" in the present invention. The electrode 31d is connected to the front end 3a of the lead 3 through an Au wire 100. The electrode 31e is connected to the front end 21a of the lead 21 through an Au wire 100. The submount 31 is so formed as to function as a heatsink of the semiconductor laser device 30.

According to the third embodiment, a surface along arrow Y2 which is a back surface of the semiconductor laser element portion 8 is mounted on the electrode 31d of the submount 31 through the conductive bonding layer (not shown) such as AuSn solder or the like. Thus, the back surface of the semiconductor laser element portion 8 is electrically connected to the lead 3 through the electrode 31d and a wire 100. A surface 8c of the semiconductor laser element portion 8 along arrow Y1 is connected to the electrode 31e of the submount 31 through an Au wire 100. Thus, the surface 8c of the semiconductor laser element portion 8 is electrically connected to the lead 21 through the electrode 31e and the two wires 100.

The remaining structure of the semiconductor laser device 30 according to the third embodiment is similar to that of the semiconductor laser device according to the aforementioned second embodiment.

According to the third embodiment, as hereinabove described, the electrode 31e of the submount 31 is connected to an opposite surface 8c (along arrow Y1) of the semiconductor laser element portion 8 to the back surface through the Au wire 100 and the electrode 31e is connected to the front end 21a of the lead 21 through the Au wire 100. Thus, a length of the Au wire 100 can be reduced as compared with a case where the surface 8c which is an upper surface of the semiconductor laser element portion 8 and the front end 21a of the lead 21 are directly connected to each other through the Au wire 100. Consequently, inductance of the semiconductor laser device 30 can be reduced and hence high speed responsibility can be improved.

The remaining effects of the third embodiment are similar to those of the aforementioned second embodiment.

Fourth Embodiment

Figure 9:
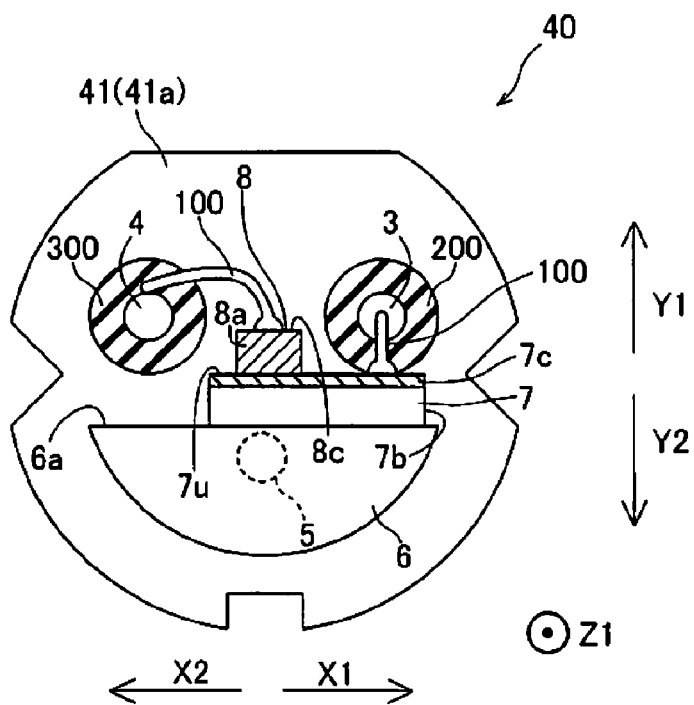
FIG. 9 is a front elevational view of a semiconductor laser device according to a fourth embodiment of the present invention, as viewed from a side of an emission direction of a laser beam.

Referring to FIG. 9, in a semiconductor laser device 40 according to a fourth embodiment, the outer shape of the base 41 is formed in a circle having a portion along arrow Y1 which is partially cut, dissimilarly to the aforementioned first embodiment. The base 41 is an example of the "body" in the present invention. The structure shown in FIG. 9 similar to that of the first embodiment is denoted by the same reference numerals.

As shown in FIG. 9, the semiconductor laser device 40 according to the fourth embodiment comprises the base 41, leads 3, 4 and 5 mounted on the base 41 and electrically isolated from each other and a header 6 mounted on the base 41, and the base 41, the lead 5 and the header 6 constitute a package. The semiconductor laser device 40 further comprises a submount 7 made of aluminum nitride (AlN) mounted on the header 6 and a semiconductor laser element portion 8 mounted on the submount 7.

According to the fourth embodiment, the leads 3 and 4 are so arranged as to pass through a surface 41a of the base 41 along arrow Z1 (on a front side) and a surface of the base 41 along arrow Z2 (on a rear side), respectively. The surface 41a is an example of the "third surface portion" in the present invention. The header 6 is mounted on the surface 41a of the base 41, and the base 41 and the header 6 are electrically connected to each other.

According to the fourth embodiment, the base 41 is formed in the circle having the portion along arrow Y1 which is partially cut as shown in FIG. 9. More specifically, one part of the outer shape of the base 41 along arrow Y1 (on a side on which the header 6 is not arranged with respect to a center of the base 41) is linearly formed and a portion (on a side on which the header is arranged with respect to the center of the base 41) other than the linearly formed portion is formed in an arc shape, as viewed from a side of an emission direction of a laser beam (along arrow Z1). The base 41 is made of metal such as iron or copper and hence has high heat radiability.

The remaining structure of the semiconductor laser device 40 according to the fourth embodiment is similar to that of the semiconductor laser device according to the aforementioned first embodiment.

According to the fourth embodiment, as hereinabove described, the base 41 is formed in the circle having the portion along arrow Y1 which is partially cut. In other words, the one part of the outer shape of the base 41 on the side of the emission direction of the laser beam (along arrow Z1) is linearly formed along arrow Y1 and the portion other than the aforementioned one part is formed in the arc shape. Thus, a height of the base 41 in a vertical direction (along arrows Y1 and Y2) can be suppressed, and hence the semiconductor laser device 40 can be downsized.

The effects of the fourth embodiment are similar to those of the aforementioned first embodiment.

While the portion along arrow Y1 is partially linearly cut with respect to the outer shape of the base 41 as viewed from the side of the emission direction of the laser beam in the fourth embodiment, the present invention is not restricted to this but a portion on a side in other direction may be linearly cut.

Fifth Embodiment

Figure 10:
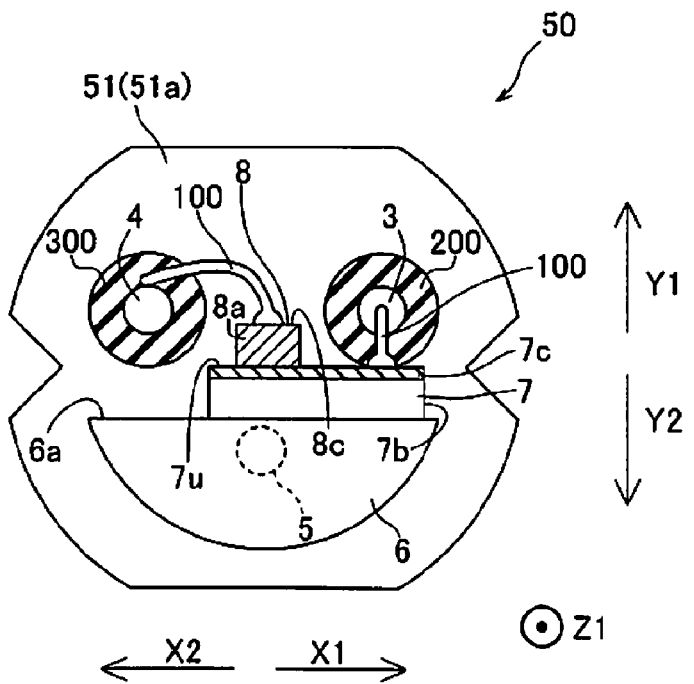
FIG. 10 is a front elevational view of a semiconductor laser device according to a fifth embodiment of the present invention, as viewed from a side of an emission direction of a laser beam.

Referring to FIG. 10, in a semiconductor laser device 50 according to a fifth embodiment, the outer shape of a base 51 is formed in a circle having a portion along arrow Y1 and a portion along arrow Y2 which are partially cut, dissimilarly to the aforementioned first embodiment. The base 51 is an example of the "body" in the present invention. The structure shown in FIG. 10 similar to that of the first embodiment is denoted by the same reference numerals.

As shown in FIG. 10, the semiconductor laser device 50 according to the fifth embodiment comprises the base 51, leads 3, 4 and 5 mounted on the base 51 and electrically isolated from each other and a header 6 mounted on the base 51, and the base 51, the lead 5 and the header 6 constitute a package. The semiconductor laser device 50 further comprises a submount 7 made of aluminum nitride (AlN) mounted on the header 6 and a semiconductor laser element portion 8 mounted on the submount 7.

According to the fifth embodiment, the leads 3 and 4 are so arranged as to pass through a surface 51a of the base 51 along arrow Z1 (on a front side) and a surface of the base 51 along arrow Z2 (on a rear side), respectively. The surface 51a is an example of the "third surface portion" in the present invention. The header 6 is mounted on the surface 51a of the base 51, and the base 51 and the header 6 are electrically connected to each other.

According to the fifth embodiment, the base 51 is formed in the circle having the portion along arrow Y1 and the portion along arrow Y2 which are partially cut as shown in FIG. 10. More specifically, one part of the outer shape of the base 51 along arrow Y1 (on a side on which the header 6 is not arranged with respect to a center of the base 51) is linearly formed and one part of the outer shape of the base 51 along arrow Y2 (on a side on which the header 6 is arranged with respect to the center of the base 51) is also linearly formed. In the outer shape of the base 51, portions other than the linearly formed portions are formed in arc shapes.

According to the fifth embodiment, the two linear portions formed in the outer shape of the base 51 are formed parallel to a horizontal direction (directions along arrows X1 and X2). The base 51 is made of metal such as iron or copper and hence has high heat radiability.

The remaining structure of the semiconductor laser device 50 according to the fifth embodiment is similar to that of the semiconductor laser device according to the aforementioned first embodiment.

According to the fifth embodiment, as hereinabove described, the base 51 is formed in the circle having the portion along arrow Y1 and the portion along arrow Y2 which are partially cut. In other words, the portions along arrows Y1 and Y2 are partially linearly formed and the portions other than the linear portions are formed in arc shapes in the outer shape of the base 51 as viewed from a side of an emission direction of a laser beam (along arrow Z1). Thus, a height of the base 51 along arrows Y1 and Y2 can be suppressed, and hence the semiconductor laser device 50 can be downsized.

According to the fifth embodiment, the two linear portions formed in the outer shape of the base 51 are formed parallel to the horizontal direction (directions along arrows X1 and X2). Thus, a height of the base 51 in a vertical direction (along arrows Y1 and Y2) can be further suppressed, and hence the semiconductor laser device 50 can be downsized.

The effects of the fifth embodiment are similar to those of the aforementioned first embodiment.

While the portions along arrows Y1 and Y2 are partially linearly cut with respect to the outer shape of the base 51 as viewed from the side of the emission direction of the laser beam in the fifth embodiment, the present invention is not restricted to this but portions on sides in other directions may be linearly cut.

Sixth Embodiment

Figure 11:
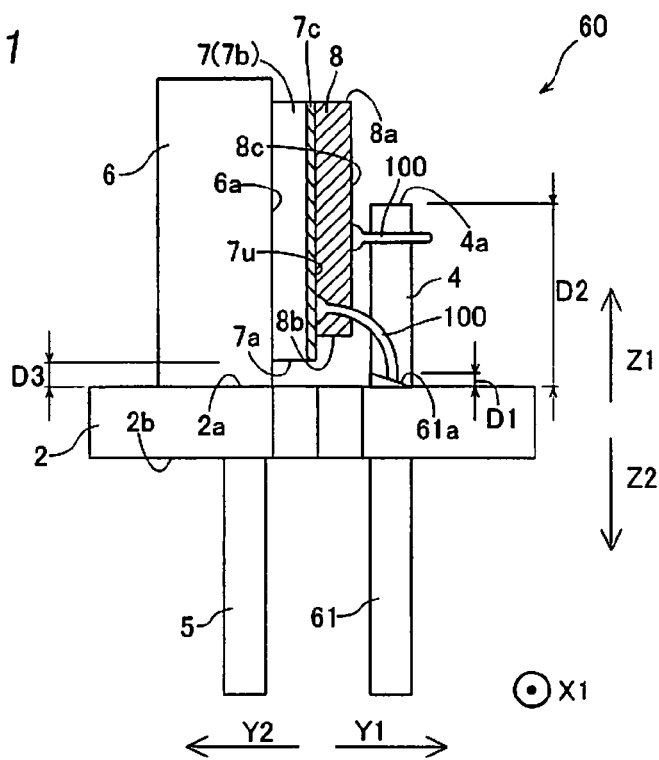
FIG. 11 is a side elevational view for illustrating a structure of a semiconductor laser device according to a sixth embodiment of the present invention.

Referring to FIG. 11, in a semiconductor laser device 60 according to a sixth embodiment, a lead 61 is so formed that a front end 61a along arrow Z1 (on a front side) is inclined with respect to an emission direction of a laser beam (along arrow Z1), dissimilarly to the aforementioned first embodiment. The lead 61 and the front end 61a are examples of the "first lead" and the "first front end" in the present invention respectively. The structure shown in FIG. 11 similar to that of the first embodiment is denoted by the same reference numerals.

The semiconductor laser device 60 according to the sixth embodiment comprises a base 2, leads 4, 5 and 61 mounted on the base 2 and electrically isolated from each other and a header 6 mounted on the base 2, as shown in FIG. 11. The semiconductor laser device 60 further comprises a submount 7 made of aluminum nitride (AlN) mounted on the header 6 and a semiconductor laser element portion 8 mounted on the submount 7.

According to the sixth embodiment, the lead 61 is made of metal and so arranged as to pass through a surface 2a of the base and a surface 2b of the base 2 along arrow Z2 (on a rear side). The lead 61 is so formed that the front end 61a on the front side (along arrow Z1) is arranged to protrude along arrow Z1 (frontward) from a surface 2a of the base 2 along arrow Z1 (on the front side) by a distance D1. The front end 61a is a front end surface formed to be inclined along arrow Y1 with respect to the emission direction (along arrow Z1) of the laser beam. In other words, the front end 61a of the lead 61 is inclined in a direction for forming an obtuse angle with respect to the surface portion 7u (including electrode 7c) along arrow Y1 which is an upper surface of the submount 7.

According to the sixth embodiment, an electrode 7c of the submount 7 is connected to the front end 61a of the lead 61 through an Au wire 100. Thus, a back surface of the semiconductor laser element portion 8 is electrically connected to the lead 61 through the electrode 7c and the wire 100.

The remaining structure of the semiconductor laser device 60 according to the sixth embodiment is similar to that of the semiconductor laser device according to the aforementioned first embodiment.

According to the sixth embodiment, as hereinabove described, the front end 61a of the lead 61 is so formed as to be inclined along arrow Y1 with respect to the emission direction (along arrow Z1) of the laser beam, namely, in the direction for forming the obtuse angle with respect to the surface portion 7u (including electrode 7c) along arrow Y1 which is the upper surface of the submount 7. Thus, the front end 61a is inclined in a direction (along arrow Y1) opposite to a direction (along arrow Y2) where the semiconductor laser element portion 8 is arranged and hence the electrode 7c can be easily connected to the front end 61a through the Au wire 100 without hindering of the semiconductor laser element portion 8.

The remaining effects of the sixth embodiment are similar to that of the aforementioned first embodiment.

Seventh Embodiment

Figure 12:
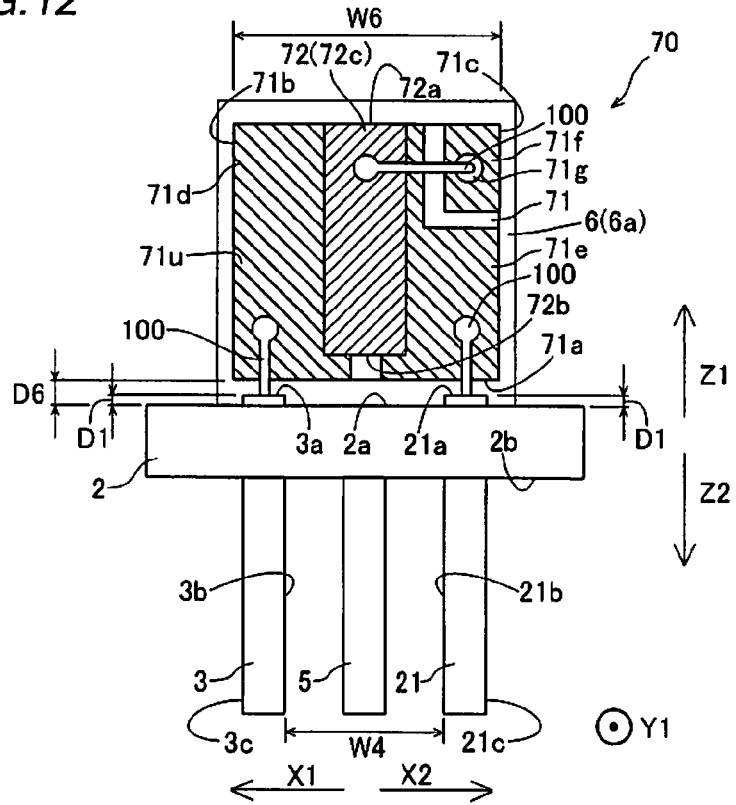
FIG. 12 is a plan view for illustrating a structure of a semiconductor laser device according to a seventh embodiment of the present invention.
Figure 13:
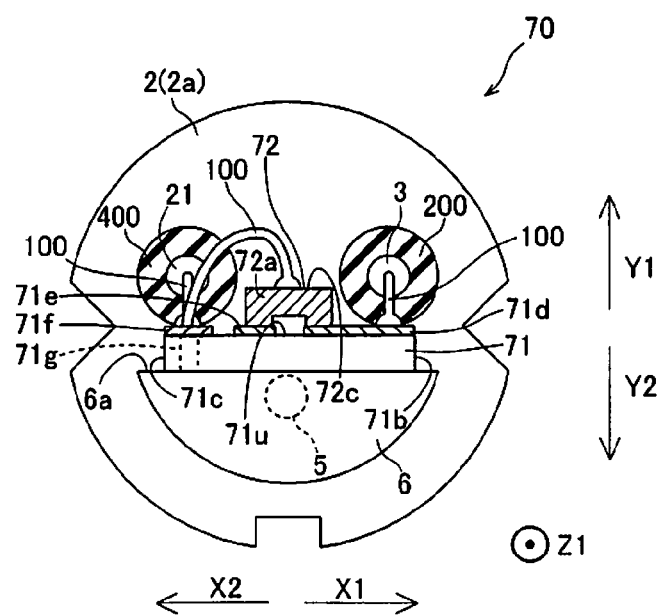
FIG. 13 is a front elevational view of a semiconductor laser device according to a seventh embodiment shown in FIG. 12, as viewed from a side of an emission direction of a laser beam.

Referring to FIGS. 12 and 13, in a semiconductor laser device 70 according to a seventh embodiment, a monolithic two-wavelength semiconductor laser element portion 72 is employed dissimilarly to the aforementioned second embodiment. The monolithic two-wavelength semiconductor laser element portion 72 is an example of the "semiconductor laser element portion" in the present invention. The structure shown in FIGS. 12 and 13 similar to that of the second embodiment is denoted by the same reference numerals.

The semiconductor laser device 70 according to the seventh embodiment comprises a base 2, leads 3, 5 and 21 mounted on the base 2 and electrically isolated from each other and a header 6 mounted on the base 2, as shown in FIGS. 12 and 13. The semiconductor laser device 70 further comprises a submount 71 made of aluminum nitride (AlN)

mounted on the header 6 and the monolithic two-wavelength semiconductor laser element portion 72 mounted on the submount 71. The submount 71 is an example of the "second heatsink" in the present invention.

According to the seventh embodiment, the submount 71 has a rectangular parallelepiped shape, is mounted on a surface 6a along arrow Y1 which is an upper surface of the header 6 through a conductive bonding layer (not shown) such as AuSn solder, and the surface 6a of the header 6 is electrically connected to a surface portion along arrow Y2 which is a back surface of the submount 71. In the submount 71, a surface 71a along arrow Z2 (on a rear side) is arranged on a side along arrow Z1 (front side) from a surface 2a of the base 2 along arrow Z1 (on the front side) by a distance D6. The surface 71a of the submount 71 is an example of the "first rear end" in the present invention. More specifically, the submount 71 is so arranged that the distance D6 is larger than a distance D1. In other words, the surface 71a of the submount 71 along arrow Z2 (on the rear side) is arranged to be closer to the side along arrow Z1 (front side) than a front end 3a of the lead 3 and a front end 21a of the lead 21.

As shown in FIG. 12, a side surface 71b of the submount 71 along arrow X1 is arranged outward (on a side along arrow X1) in a horizontal direction beyond an inner side surface 3b which is a side surface of the lead 3. Further, the side surface 71b is arranged outward in the horizontal direction beyond an outer side surface 3c which is a side surface of the lead 3 along arrow X1. The side surface 71b of the submount 71 along arrow X1 is an example of the "first side surface" in the present invention.

A side surface 71c (second side surface of the second heatsink) of the submount 71 along arrow X2 is arranged outward (on a side along arrow X2) in the horizontal direction beyond an inner side surface 21b which is a side surface of the lead 21 along arrow X1. Further, the side surface 71c is arranged outward beyond an outer side surface 21c which is a side surface of the lead 21 along arrow X2. Thus, a width W6 of the submount 71 along arrows X1 and X2 (in a direction perpendicular to the emission direction of the laser beam (along arrow Z1)) can be rendered larger than an inner interval W4 between the lead 3 and the lead 21.

The submount 71 includes an electrode 71d, an electrode 71e and electrode 71f each made of a Ti layer, a Pt layer and an Au layer and electrically isolated from each other on a surface portion 71u along arrow Y1 which is an upper surface. The surface portion 71u of the submount 71 is an example of the "second surface portion" in the present invention. Each of the electrodes 71d and 71e is an example of the "first electrode" in the present invention, and the electrode 71f is an example of the "second electrode" in the present invention. The electrode 71d is connected to the front end 3a of the lead 3 through an Au wire 100. The electrode 71e is connected to the front end 21a of the lead 21 through an Au wire 100. The electrode 71f is provided with a tungsten via 71g bringing the surface portion 71u along arrow Y1 which is the upper surface of the submount 71 and a surface portion along arrow Y2 which is a back surface of the submount 71 into a conduction state. Thus, the electrode 71f and the header 6 are electrically connected to each other. The submount 71 is so formed as to function as a heatsink of the semiconductor laser device 70.

According to the seventh embodiment, the monolithic two-wavelength semiconductor laser element portion 72 is constituted by an infrared semiconductor laser element (not shown) emitting infrared light having a wavelength of about 780 nm and a red semiconductor laser element (not shown) emitting red light having a wavelength of about 650 nm. The surface along arrow Y2 which is the back surface of the monolithic two-wavelength semiconductor laser element portion 72 is mounted on the surface portion 71u (including the electrodes 71d, 71e and 71f) along arrow Y1 which is the upper surface of the submount 71.

More specifically, the infrared semiconductor laser element of the monolithic two-wavelength semiconductor laser element portion 72 includes a first electrode (not shown) on a surface along arrow Y2 which is a back surface and the red semiconductor laser element includes a first electrode (not shown) on a surface along arrow Y2 which is a back surface. The back side of the infrared semiconductor laser element is mounted on the electrode 71d of the submount 71 through a conductive bonding layer (not shown) made of AuSn solder and the back side of the red semiconductor laser element is mounted on the electrode 71e of the submount 71 through a conductive bonding layer (not shown) made of AuSn solder. Thus, the back surface of the infrared semiconductor laser element is electrically connected to the lead 3 through the electrode 71d and the wire 100, and the back surface of the red semiconductor laser element is electrically connected to the lead 21 through the electrode 71e and the wire 100.

A surface 72c along arrow Y1 which is an upper surface of the monolithic two-wavelength semiconductor laser element portion 72 includes a common electrode employed as second electrodes of the infrared semiconductor laser element and the red semiconductor laser element. The monolithic two-wavelength semiconductor laser element portion 72 includes a light emitting surface 72a and a light reflecting surface 72b in an extensional direction (along arrows Z1 and Z2) of a cavity. Each light intensity of an infrared laser beam and a red laser beam emitted from the light emitting surface 72a along arrow Z1 is larger than each light intensity of an infrared laser beam and a red laser beam emitted from the light reflecting surface 72b along arrow Z2.

The surface 72c along arrow Y1 which is the upper surface of the monolithic two-wavelength semiconductor laser element portion 72 is connected to the electrode 71f of the submount 71 through an Au wire 100. Thus, the surface 72c of the monolithic two-wavelength semiconductor laser element portion 72 is electrically connected to the lead 5, and the lead 5 is employed as a common cathode of the infrared semiconductor laser element and the red semiconductor laser element.

The remaining structure of the semiconductor laser device 70 according to the seventh embodiment is similar to that of the semiconductor laser device according to the aforementioned second embodiment.

According to the seventh embodiment, as hereinabove described, the monolithic two-wavelength semiconductor laser element portion 72 is provided, whereby deterioration in heat radiability can be suppressed while enabling downsizing and high speed responsibility can be improved in the semiconductor laser device 70 capable of emitting infrared light and red light According to the seventh embodiment, the surface 72c of the monolithic two-wavelength semiconductor laser element portion 72 and the electrode 71f electrically connected to the lead 5 are connected to each other through the Au wire 100. Thus, a length of the Au wire 100 can be reduced as compared with a case where the surface 72c of the semiconductor laser element portion 72 and the base 2 are directly connected to each other through the Au wire 100. Consequently, inductance of the semiconductor laser device 70 can be reduced and hence high speed responsibility can be improved.

The remaining effects of the seventh embodiment are similar to those of the aforementioned second embodiment.

Eighth Embodiment

Figure 14:
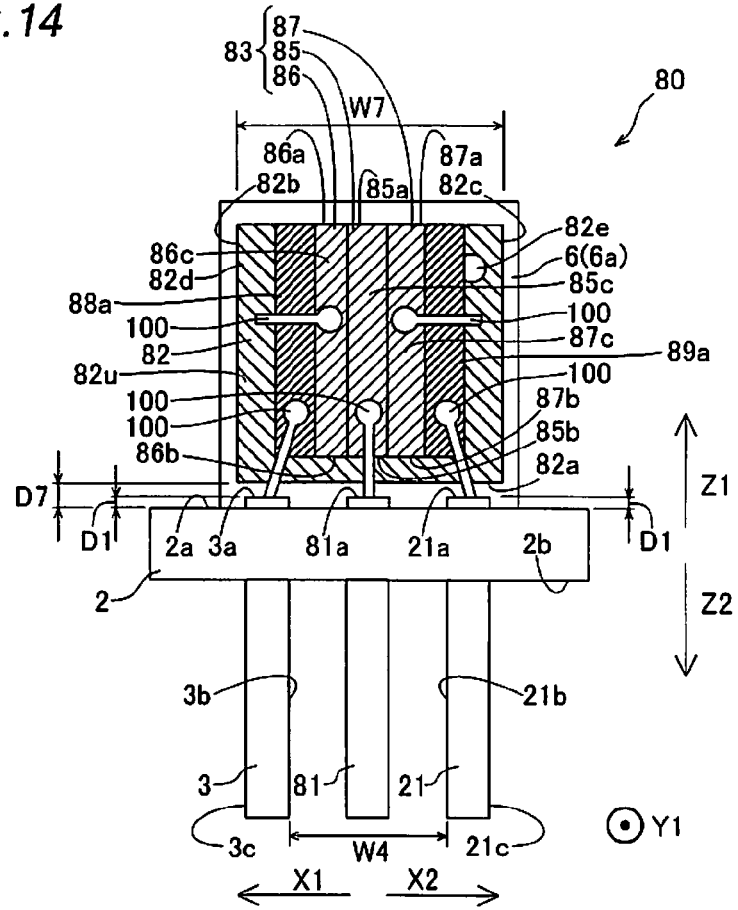
FIG. 14 is a plan view for illustrating a structure of a semiconductor laser device according to an eighth embodiment of the present invention.
Figure 15:
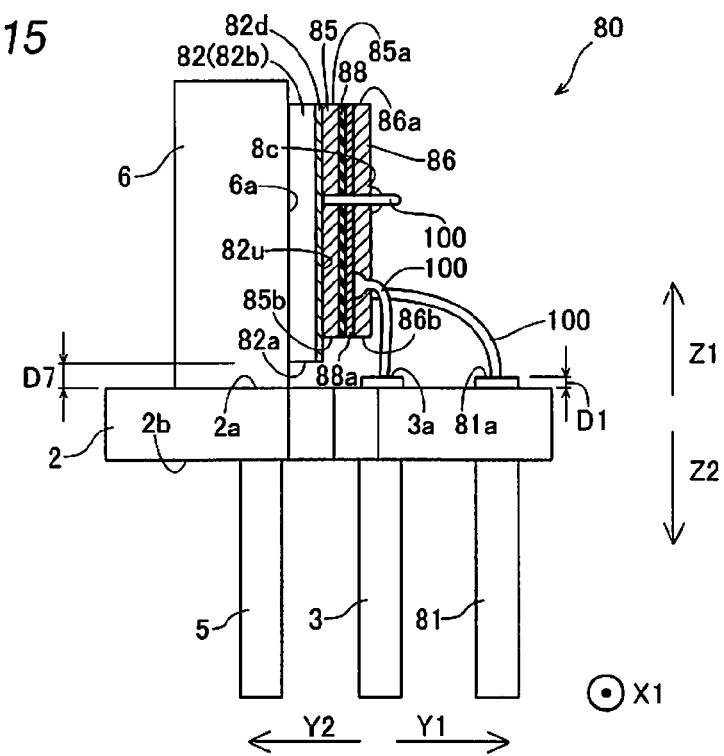
FIG. 15 is a side elevational view for illustrating the structure of the semiconductor laser device according to the eighth embodiment shown in FIG. 14.
Figure 16:
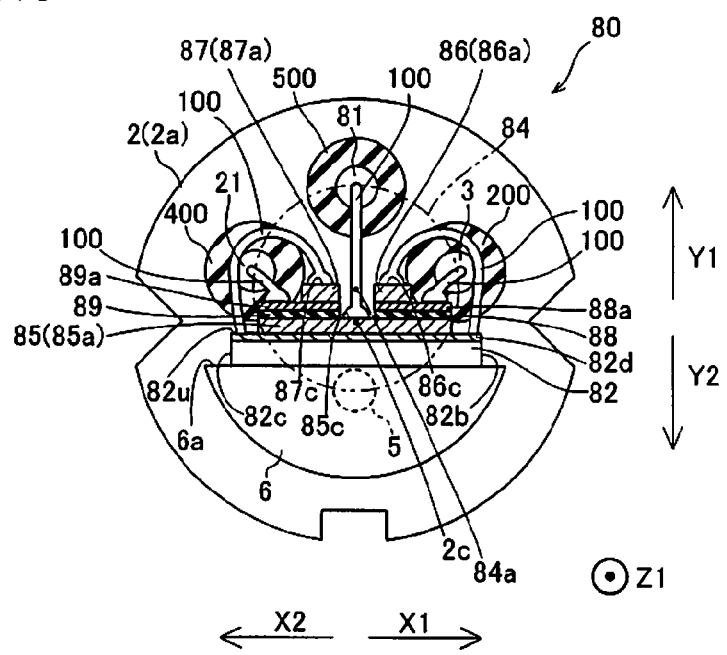
FIG. 16 is a front elevational view of the semiconductor laser device according to the eighth embodiment shown in FIG. 14, as viewed from a side of an emission direction of a laser beam.

Referring to FIGS. 14 to 16, in a semiconductor laser device 80 according to an eighth embodiment, a three-wavelength semiconductor laser element portion 83 is employed dissimilarly to the aforementioned second embodiment. The three-wavelength semiconductor laser element portion 83 is an example of the "semiconductor laser element portion" in the present invention. The structure shown in FIGS. 14 to 16 similar to that of the second embodiment is denoted by the same reference numerals.

The semiconductor laser device 80 according to the eighth embodiment comprises a base 2, leads 3, 5, 21 and 81 mounted on the base 2 and electrically isolated from each other and a header 6 mounted on the base 2, as shown in FIGS. 14 to 16. The semiconductor laser device 80 further comprises a submount 82 made of aluminum nitride (AlN) mounted on the header 6 and the three-wavelength semiconductor laser element portion 83 mounted on the submount 82. The submount 82 is an example of the "second heatsink" in the present invention.

According to the eighth embodiment, the lead 81 is made of metal and so arranged as to pass through the base 2. The lead 81 is so formed that a front end 81a along arrow Z1 (on a front side) is arranged to protrude along arrow Z1 (frontward) from a surface 2a of the base 2 along arrow Z1 (on the front side) by a distance D1. In other words, the front end 3a of the lead 3, the front end 21a of the lead 21 and the front end 81a of the lead 81 are arranged on the same plane perpendicular to an emission direction of a laser beam (direction along arrow Z1). The lead 81 and the front end 81a are examples of the "second lead" and the "second front end" in the present invention respectively.

As shown in FIG. 16, the leads 3, 5, 21 and 81 are arranged on a segment constituting a prescribed circle 84 as viewed from a side along arrow Z1 (front side). A center 84a of the prescribed circle 84 is arranged to deviate from a center 2c of the base 2 in a direction for separating from the upper surface 6a of the header 6 (along arrow Y1). Thus, the leads 3, 21 and 81 can be separated as far as possible from the header 6 arranged on a side along arrow Y2. The lead 81 is covered with an insulator 500 made of glass on a through portion of the base 2. Thus, the lead 81 is electrically insulated from the base 2.

According to the eighth embodiment, the submount 82 has a rectangular parallelepiped shape, is mounted on the surface 6a along arrow Y1 which is the upper surface of the header 6 through a conductive bonding layer (not shown) such as AuSn solder, and the surface 6a of the header 6 is electrically connected to a surface portion along arrow Y2 which is a back surface of the submount 82. In the submount 82, a surface 82a along arrow Z2 (on a rear side) is arranged on the side along arrow Z1 (front side) from the surface 2a of the base 2 along arrow Z1 (on the front side) by a distance D7. The surface 82a of the submount 82 is an example of the "first rear end" in the present invention.

More specifically, the submount 82 is so arranged that the distance D7 is larger than the distance D1. In other words, the surface 82a of the submount 82 along arrow Z2 (on the rear side) is arranged to be closer to the side along arrow Z1 (front side) than a front end 3a of the lead 3, a front end 21a of the lead 21 and a front end 81a of the lead 81.

As shown in FIG. 14, a side surface 82b of the submount 82 along arrow X1 is arranged outward in a horizontal direction beyond an inner side surface 3b which is a side surface of the lead 3 along arrow X2. Further, the side surface 82b is arranged outward in the horizontal direction beyond an outer side surface 3c which is a side surface of the lead 3 along arrow X1. The side surface 82b of the submount 82 along arrow X1 is an example of the "first side surface" in the present invention.

A side surface 82c (second side surface of the second heatsink) of the submount 82 along arrow X2 is arranged outward in the horizontal direction beyond an inner side surface 21b which is a side surface of the lead 21 along arrow X1. Further, the side surface 82c is arranged outward beyond an outer side surface 21c which is a side surface of the lead 21 along arrow X2. Thus, a width W7 of the submount 82 along arrows X1 and X2 (in a direction perpendicular to an emission direction of a laser beam (along arrow Z1)) can be rendered larger than an inner interval W4 between the lead 3 and the lead 21.

The submount 82 includes an electrode 82d made of a Ti layer, a Pt layer and an Au layer on a surface portion 82u along arrow Y1 which is an upper surface. The surface portion 82u of the submount 82 is an example of the "second surface portion" in the present invention. The electrode 82d is provided with a tungsten via 82e bringing the surface portion 82u along arrow Y1 which is the upper surface of the submount 82 and a surface portion along arrow Y2 which is a back surface of the submount 82 into a conduction state. Thus, the electrode 82d and the header 6 are electrically connected to each other. The submount 82 is so formed as to function as a heatsink of the semiconductor laser device 80.

According to the eighth embodiment, the three-wavelength semiconductor laser element portion 83 is constituted by a blue-violet semiconductor laser element 85 emitting blue-violet light having a wavelength of about 405 nm, an infrared semiconductor laser element 86 emitting infrared light having a wavelength of about 780 nm and a red semiconductor laser element 87 emitting red light having a wavelength of about 650 nm. The blue-violet semiconductor laser element 85 has a light emitting surface 85a and a light reflecting surface 85b in an extensional direction (along arrows Z1 and Z2) of a cavity.

The infrared semiconductor laser element 86 includes a light emitting surface 86a and a light reflecting surface 86b in an extensional direction (along arrows Z1 and Z2) of a cavity. The red semiconductor laser element 87 includes a light emitting surface 87a and a light reflecting surface 87b in an extensional direction (along arrows Z1 and Z2) of a cavity. Each light intensity of respective colored laser beams emitted from the light emitting surfaces 85a, 86a and 87a of the semiconductor laser elements 85, 86 and 87 along arrow Z1 is larger than each light intensity of respective laser beams emitted from the light reflecting surfaces 85b, 86b and 87b along arrow Z2.

The blue-violet semiconductor laser element 85 includes a first electrode (not shown) on a surface along arrow Y2 which is a back surface, and the back surface of the blue-violet semiconductor laser element 85 is mounted on the electrode 82d of the submount 82 through a conductive bonding layer (not shown) such as AuSn solder. Thus, the back surface of the blue-violet semiconductor laser element 85 is electrically connected to the header 6 through the electrode 82d and the tungsten via 82e. The blue-violet semiconductor laser element 85 includes a second electrode (not shown) on a surface 85c along arrow Y1 which is an upper surface, and insulating films 88 and 89 made of $SiO_2$ are formed on the surface 85c with a prescribed interval therebetween.

Electrodes 88a and 89a electrically isolated (insulated) from each other are formed on surfaces of the insulating films 88 and 89 along arrow Y2. The surface 85c along arrow Y1 which is the upper surface of the blue-violet semiconductor laser element 85, exposed between the insulating films 88 and 89 is connected to the front end 81a of the lead 81 through an Au wire 100. Thus, the surface 85c of the blue-violet semiconductor laser element 85 is electrically connected to the lead 81.

The infrared semiconductor laser element 86 includes a first electrode (not shown) on a surface along arrow Y2 which is a back surface, and the back surface of the infrared semiconductor laser element 86 is mounted on a surface along arrow Y1 which is an upper surface of the electrode 88a through a conductive bonding layer (not shown) such as AuSn solder. The electrode 88a is connected to the front end 3a of the lead 3 through an Au wire 100. Thus, the back surface of the infrared semiconductor laser element 86 is electrically connected to the lead 3.

The infrared semiconductor laser element 86 includes a second electrode (not shown) on a surface 86c along arrow Y1 which is an upper surface, and the surface 86c is connected to the electrode 82d of the submount 82 through an Au wire 100. Thus, the surface 86c of the infrared semiconductor laser element 86 is electrically connected to the header 6 through the Au wire 100, the electrode 82d and the tungsten via 82e.

The red semiconductor laser element 87 includes a first electrode (not shown) on a surface along arrow Y2 which is a back surface, and the back surface of the red semiconductor laser element 87 is mounted on a surface along arrow Y1 which is an upper surface of the electrode 89a through a conductive bonding layer (not shown) such as AuSn solder. The electrode 89a is connected to the front end 21a of the lead 21 through an Au wire 100. Thus, the back surface of the red semiconductor laser element 87 is electrically connected to the lead 3.

The red semiconductor laser element 87 includes a second electrode (not shown) on a surface 87c along arrow Y1 which is an upper surface, and the surface 87c is connected to the electrode 82d of the submount 82 through an Au wire 100. Thus, the surface 87c of the red semiconductor laser element 87 is electrically connected to the header 6 through the Au wire 100, the electrode 82d and the tungsten via 82e.

As hereinabove described, the back surface of the blue-violet semiconductor laser element 85, the surface 86c of the infrared semiconductor laser element 86 and the surface 87c of the red semiconductor laser element 87 are electrically connected to the header 6 through the electrode 82d, and further electrically connected to the lead 5 through the base 2. Thus, the lead 5 is employed as a common cathode of the blue-violet semiconductor laser element 85, the infrared semiconductor laser element 86 and the red semiconductor laser element 87.

The remaining structure of the semiconductor laser device 80 according to the eighth embodiment is similar to that of the semiconductor laser device according to the aforementioned second embodiment.

According to the eighth embodiment, as hereinabove described, the three-wavelength semiconductor laser element portion 83 is provided, whereby deterioration in heat radiability can be suppressed while enabling downsizing and high speed responsibility can be improved in the semiconductor laser device 80 capable of emitting blue-violet light, infrared light and red light.

According to the eighth embodiment, the surface 86c along arrow Y1 which is the upper surface of the infrared semiconductor laser element 86 and the surface 87c along arrow Y1 which is the upper surface of the red semiconductor laser element 87 are connected to the electrode 82d electrically connected to the lead 5 through the Au wires 100. Thus, a length of each Au wire 100 can be reduced as compared with a case where the surface 86c of the infrared semiconductor laser element 86 and the surface 87c of the red semiconductor laser element 87 are directly connected to the base 2 through the Au wires 100. Consequently, inductance of the semiconductor laser device 80 can be reduced and hence high speed responsibility can be improved.

According to the eighth embodiment, the front end 3a of the lead 3, the front end 21a of the lead 21 and the front end 81a of the lead 81 are arranged to be closer to the side along arrow Z2 (rear side) than the surface 82a of the submount 82 along arrow Z2 (on the rear side), whereby the width W7 of the submount 82 can be widened outward (along arrow X1). According to this structure, the volume of the submount 82 can be increased without increasing the semiconductor laser device 80, and hence deterioration in heat radiability can be suppressed while enabling downsizing.

According to the eighth embodiment, the front end 3a of the lead 3, the front end 21a of the lead 21 and the front end 81a of the lead 81 are connected to the blue-violet semiconductor laser element 85, the infrared semiconductor laser element 86 and the red semiconductor laser element 87 through the Au wires 100 respectively, whereby the semiconductor laser elements 85, 86 and 87 and the front ends 3a, 21a and 81a of the leads 3, 21 and 81 can be easily connected to each other respectively. Further, the connection can be made through the Au wires 100 having short lengths as close as possible to the shortest distances from the respective semiconductor laser elements 85, 86 and 87 to the respective leads 3, 21 and 81 respectively, and hence inductance of each Au wire 100 can be reduced as small as possible. Thus, inductance of the semiconductor device 80 is reduced as small as possible and high speed responsibility can be improved.

According to the eighth embodiment, the front end 3a of the lead 3, the front end 21a of the lead 21 and the front end 81a of the lead 81 are arranged on the same plane perpendicular to an emission direction of a laser beam (direction along arrow Z1). Thus, the position of the surface 82a of the submount 82 is not restricted by the position(s) of the front end of any of the leads 3, 21 and 81 which is (are) arranged to be closer to the front side (along arrow Z1), dissimilarly to a case where the positions of the front ends 3a, 21a and 81a of the leads 3, 21 and 81 deviate from each other. Consequently, the overall surface 82a of the submount 82 can be widened rearward (along arrow Z2), and hence deterioration in heat radiability can be further suppressed.

The remaining effects of the eighth embodiment are similar to those of the aforementioned second embodiment.

Ninth Embodiment

Figure 17:
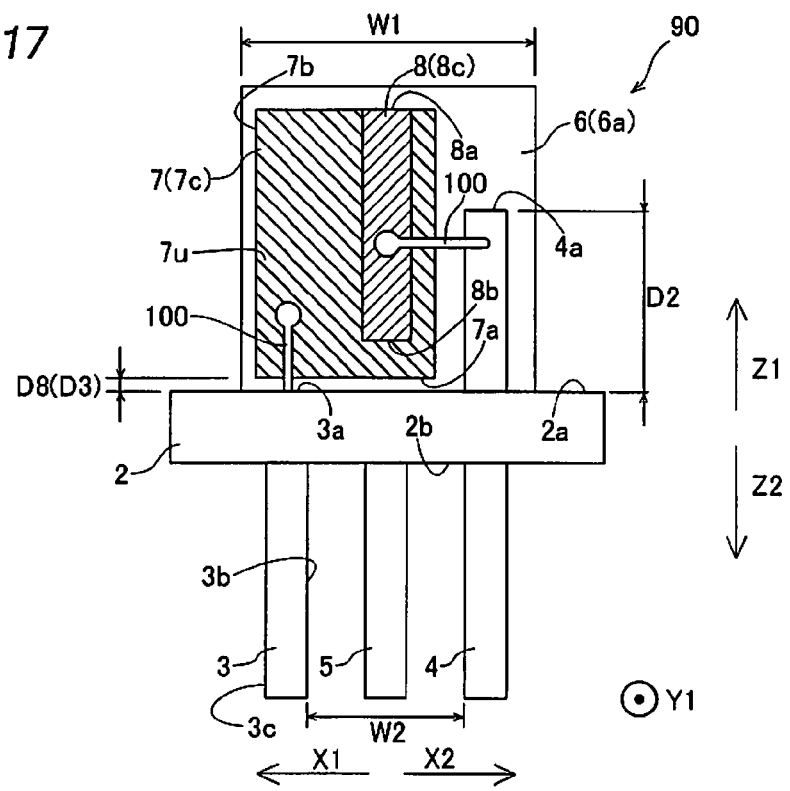
FIG. 17 is a plan view for illustrating a structure of a semiconductor laser device according to a ninth embodiment of the present invention.
Figure 18:
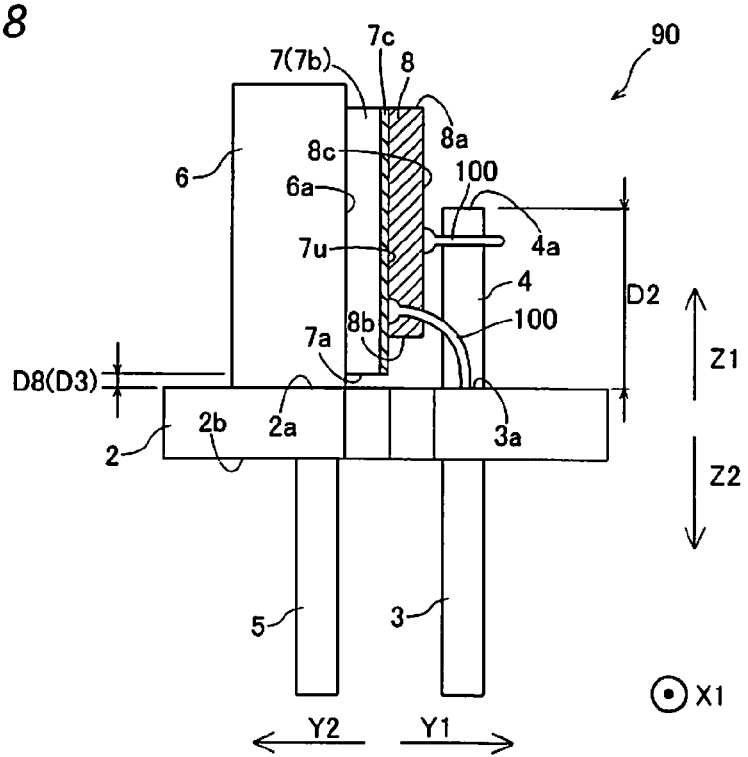
FIG. 18 is a side elevational view for illustrating a structure of the semiconductor laser device according to the eighth embodiment shown in FIG. 17.

Referring to FIGS. 17 and 18, in a semiconductor laser device 90 according to a ninth embodiment, a front end 3a of a lead 3 along arrow Z1 (on a front side) and a surface 2a of a base 2 along arrow Z1 (on the front side) are arranged on the same plane (so that a distance D1 shown in FIGS. 1 and 2 is 0), dissimilarly to the aforementioned first embodiment. The structure shown in FIGS. 17 and 18 similar to that of the first embodiment is denoted by the same reference numerals.

As shown in FIGS. 17 and 18, in the semiconductor laser device 90 according to the ninth embodiment, the front end 3a of the lead 3 along arrow Z1 (on the front side) is so provided as to arranged on the same plane as the surface 2a of the base 2 along arrow Z (on the front side) (that the distance D1 shown in FIGS. 1 and 2 is 0). In other words, the front end 3a of the lead 3 does not protrude along arrow Z1 (frontward) from the surface 2a of the base 2 along arrow Z1 (on the front side), and a distance D3 between a surface 7a of a submount 7 along arrow Z2 (on a rear side) and the surface 2a of the base 2 along arrow Z1 (on the front side) and a distance D8 between the surface 7a of the submount 7 along arrow Z2 (on the rear side) and the front end 3a of the lead 3 along arrow Z1 (on the front side) are substantially the same distance.

The remaining structure of the semiconductor laser device 90 according to the ninth embodiment is similar to that of the semiconductor laser device according to the aforementioned first embodiment.

According to the ninth embodiment, as hereinabove described, the lead 3 is so provided that the front end 3a along arrow Z1 (on the front side) is arranged on substantially the same plane as the surface 2a of the base 2 along arrow Z1 (on the front side), and hence the submount 7 can be widened rearward (along arrow Z2) of the surface 7a of the submount 7 along arrow Z2 (on the rear side). Consequently, the volume of the submount 7 can be easily increased, and hence deterioration of heat radiability can be further suppressed.

The effects of the ninth embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the semiconductor laser element portion mounted with blue-violet semiconductor laser element is employed in each of the aforementioned first to sixth embodiments and the ninth embodiment, the present invention is not restricted to this but a multiwavelength semiconductor laser element portion such as a monolithic two-wavelength semiconductor laser element portion and a three-wavelength semiconductor laser element portion, or a semiconductor laser element portion with a wavelength other than blue color may be employed. The laser beams emitted from the multiwavelength semiconductor laser element portion may have infrared color, red color, blue color or combination thereof. For example, a multiwavelength semiconductor laser element portion having a green semiconductor element (having combination of red, green and blue color) may be employed in place of the infrared semiconductor laser element.

While the three leads may be provided in the aforementioned first to sixth embodiments and the ninth embodiment, the present invention is not restricted to this but two or more leads electrically isolated from each other may be provided.

While the header 6 is mounted on the surface 2a (41a, 51a) of the base 2 (41, 51) and the lead 5 is mounted on the surface opposite to the surface 2a (41a, 51a) so that the package including the base 2 (41, 51), the header 6 and the lead 5 is integrally formed in the aforementioned first to ninth embodiments, the present invention is not restricted to this but the package may be integrally formed by press working such that the header 6 is be arranged on the surface 2a (41a, 51a) of the base 2 (41, 51) and the lead 5 is arranged on the surface opposite to the surface 2a (41a, 51a).

What is claimed is:

1. A semiconductor laser device comprising:
a package including a body and a first heatsink;
a second heatsink mounted on a surface portion of said first heatsink;
a semiconductor laser element portion mounted on a surface portion of said second heatsink; and
a first lead mounted by passing through a surface portion of said body arranged with said first heatsink, wherein
a front end of said first lead is arranged rearward beyond a rear end of said second heatsink in a case where an emission direction of a laser beam from said semiconductor laser element portion is a front side, and
said surface portion of said second heatsink electrically connected to said semiconductor laser element portion is electrically connected to said front end of said first lead.

2. The semiconductor laser device according to claim 1, wherein
said surface portion and said front end of said first lead are connected to each other through a wire.

3. The semiconductor laser device according to claim 1, wherein
a side surface of said second heatsink is arranged outward beyond an inner side surface of said first lead in a horizontal direction, where said horizontal direction is a direction perpendicular to said emission direction and parallel to said surface portion of said first heatsink.

4. The semiconductor laser device according to claim 3, wherein
said side surface of said second heatsink is arranged outward beyond an outer side surface of said first lead in said horizontal direction.

5. The semiconductor laser device according to claim 1, further comprising a second lead mounted by passing through said surface portion of said body and electrically isolated from said first lead, wherein
a front end of said second lead is arranged rearward beyond said rear end of said second heatsink, and
said semiconductor laser element portion is electrically connected to said front end of said second lead.

6. The semiconductor laser device according to claim 5, wherein
said surface portion has a first electrode and a second electrode electrically isolated from each other,
said first electrode is electrically connected to a back surface of said semiconductor laser element portion, and
said second electrode is electrically connected to an opposite surface of said semiconductor laser element portion to said back surface and also electrically connected to said front end of said second lead.

7. The semiconductor laser device according to claim 5, wherein
said front end of said first lead and said front end of said second lead are arranged at the same plane perpendicular to said emission direction.

8. The semiconductor laser device according to claim 5, wherein
a first side surface of said second heatsink is arranged outward in a horizontal direction beyond an inner side surface of said first lead and a second side surface of said second heatsink on a side on which said second lead is arranged is arranged outward in said horizontal direction beyond an inner side surface of said second lead, where said horizontal direction is a direction perpendicular to said emission direction and parallel to said first surface portion.

9. The semiconductor laser device according to claim 8, wherein
said first side surface is arranged outward in said horizontal direction beyond an outer side surface of said first lead, and said second side surface is arranged outward in said horizontal direction beyond an outer side surface of said second lead.

10. The semiconductor laser device according to claim 5, wherein
   a width of said first heatsink in a horizontal direction is larger than an inner interval between said first lead and said second lead, where said horizontal direction is a direction perpendicular to said emission direction and parallel to said surface portion of said first heatsink.

11. The semiconductor laser device according to claim 5, wherein
   a width of said second heatsink in a horizontal direction is larger than an inner interval between said first lead and said second lead, where said horizontal direction is a direction perpendicular to said emission direction and parallel to said surface portion of said first heatsink.

12. The semiconductor laser device according to claim 5, wherein
   said body has an substantially circular outer shape as viewed from a side of said emission direction,
   said package further includes a third lead arranged on said body and electrically isolated from said first lead and said second lead,
   said first lead, said second lead and said third lead are arranged on a segment constituting a prescribed circle as viewed from the side of said emission direction, and
   a center of said prescribed circle is arranged to deviate from a center of said body in a direction for separating from said first heatsink.

13. The semiconductor laser device according to claim 1, wherein
   said front end of said first lead is arranged on substantially the same plane as said surface portion of said body.

14. The semiconductor laser device according to claim 1, wherein
   one part of an outer shape of said body as viewed from a side of said emission direction is formed in a linear shape and a portion other than said one part is formed in an arc shape.

15. The semiconductor laser device according to claim 14, wherein
   at least two of portions each having said linear shape are formed.

16. The semiconductor laser device according to claim 1, wherein
   said front end of said first lead is inclined in a direction for forming an obtuse
   angle with respect to said surface portion of said second heatsink.

17. The semiconductor laser device according to claim 1, further comprising a second lead mounted by passing through said surface portion of said body and electrically isolated from said first lead, wherein
   a front end of said second lead is arranged frontward beyond said rear end of said second heatsink.

18. The semiconductor laser device according to claim 17, wherein
   a width of said first heatsink in a horizontal direction is larger than an inner interval between said first lead and said second lead, where said horizontal direction is a direction perpendicular to said emission direction and parallel to said surface portion of said first heatsink.

19. The semiconductor laser device according to claim 17, wherein
   said body has an substantially circular outer shape as viewed from a side of said emission direction; and
   said package further includes a third lead arranged on said body and electrically isolated from said first lead and said second lead,
   said first lead, said second lead and said third lead are arranged on a segment constituting a prescribed circle as viewed from the side of said emission direction, and
   a center of said prescribed circle is arranged to deviate from a center of said body in a direction for separating from said first heatsink.

* * * * *